US008612503B2

(12) United States Patent
Gunwani et al.

(10) Patent No.: US 8,612,503 B2
(45) Date of Patent: Dec. 17, 2013

(54) METHODS AND APPARATUSES FOR FLEXIBLE AND HIGH PERFORMANCE DIGITAL SIGNAL PROCESSING

(75) Inventors: Manoj Gunwani, Bangalore (IN); Harekrishna Verma, Bangalore (IN)

(73) Assignee: Integrated Device Technology, Inc., San Jose, CA (US)

( * ) Notice: Subject to any disclaimer, the term of this patent is extended or adjusted under 35 U.S.C. 154(b) by 946 days.

(21) Appl. No.: 12/724,510

(22) Filed: Mar. 16, 2010

(65) Prior Publication Data

US 2011/0231463 A1    Sep. 22, 2011

(51) Int. Cl.
*G06F 17/10* (2006.01)
(52) U.S. Cl.
USPC .......................................... 708/316; 708/319
(58) Field of Classification Search
USPC .................................. 708/316, 319
See application file for complete search history.

(56) References Cited

U.S. PATENT DOCUMENTS

| 4,323,980 | A | 4/1982 | Houdard et al. |
| 4,817,025 | A | 3/1989 | Asai et al. |
| 5,081,604 | A | 1/1992 | Tanaka |
| 5,392,230 | A | 2/1995 | Christopher |
| 6,889,239 | B2 * | 5/2005 | Akahori ........................ 708/313 |
| 6,963,890 | B2 * | 11/2005 | Dutta et al. ................... 708/319 |
| 7,353,243 | B2 * | 4/2008 | Scheuermann et al. ...... 708/319 |
| 8,078,834 | B2 * | 12/2011 | Garde ............................. 712/16 |
| 2005/0144210 | A1 | 6/2005 | Simkins et al. |
| 2005/0144211 | A1 | 6/2005 | Simkins et al. |
| 2005/0144215 | A1 | 6/2005 | Simkins et al. |

OTHER PUBLICATIONS

Xtreme DSP for Virtex-4 FPGAs, User Guide, UG073 (v2.7), May 15, 2008.
Virtex-5 FPGA XtremeDSP Design Considerations, User Guide, UG193 (v3.3), Jan. 12, 2009.

* cited by examiner

*Primary Examiner* — Chuong D Ngo
(74) *Attorney, Agent, or Firm* — TraskBritt P.C.

(57) ABSTRACT

A Signal Processing Engine (SPE) includes circuitry for generating a selectable forward tap and a selectable reverse tap from a forward delay chain and a reverse delay chain, respectively. An add/subtract unit arithmetically combines the selectable forward tap and the selectable reverse tap to generate an intermediate output. A multiplier combines the intermediate output and a coefficient output from a circular coefficient buffer to generate a multiply result. Another adder/subtractor combines the multiply result with a second term including a processed input or an accumulator feedback by bypassing, adding, or subtracting the second term with the multiply result to generate an accumulator output. The accumulator output may be delayed a programmable number of clock cycles to generate a processed output. In some embodiments, the SPE is coupled to programmable logic blocks forming a programmable logic array through a programmable SPE routing block.

33 Claims, 27 Drawing Sheets

METHODS AND APPARATUSES FOR FLEXIBLE AND HIGH PERFORMANCE DIGITAL SIGNAL PROCESSING

TECHNICAL FIELD

Embodiments of the present disclosure relate generally to signal processing and, more particularly, to methods and apparatuses for incorporating custom signal processing engines in programmable logic arrays.

BACKGROUND

Programmable logic devices (PLDs) are general-purpose circuits that can be programmed by an end user to perform one or more selected functions. Complex PLDs (may also be referred to herein as programmable logic arrays) typically include a number of programmable logic elements and some programmable routing resources. Programmable logic elements have many forms and many names, such as Configurable Logic Blocks (CLBs), logic blocks, logic array blocks, logic cell arrays, macrocells, logic cells, and functional blocks. Programmable routing resources also have many forms and many names.

A field-programmable gate array (FPGA) is a popular type of PLD. FPGAs generally include an array of identical CLB tiles that are programmable both in function and connection to other CLBs. Some PLDs have been proposed that include fixed design memory blocks, such as Random Access Memory (RAM), and Read Only Memory (ROM) that can interface to the CLBs. Still other PLDs have been proposed that include fixed design digital signal processors and general processors that can interface to the CLBs.

However, many of the signal processors that are custom designed may have significant bottlenecks when having to interface with CLBs. Furthermore, some of the proposed signal processors are designed much like a general purpose processor with microcode to make it very flexible. However, this flexibility, while it may allow many possible operations, may also influence overall performance.

There is a need for an improved signal processor configured for flexibility to adapt for different applications and data characteristics yet structured enough to enhance performance for target applications. Furthermore, there is a need for an improved signal processor that can be incorporated in a programmable logic array.

BRIEF SUMMARY OF THE INVENION

Embodiments of the present invention include a custom signal processor configured for flexibility to adapt to different applications and data characteristics. Some embodiments of the signal processor are configured for incorporation in a programmable logic array.

In one embodiment of the invention, a Signal Processing Engine (SPE) includes a forward delay chain operably coupled between a forward data input and a forward data output and configured for generating a selectable forward tap. A reverse delay chain is operably coupled between a reverse data input and a reverse data output and is configured for generating a selectable reverse tap. A coefficient buffer is configured for circulating coefficients within the coefficient buffer and generating a coefficient output. An add/subtract unit is configured for adding or subtracting the selectable forward tap and the selectable reverse tap to generate an intermediate output. A multiply unit is configured to generate a process output by multiplying the intermediate output and the coefficient output to generate a multiply result, which can be combined with a process input by bypassing, adding, or subtracting the process input with the multiply result. An output delay chain is configured for generating a delayed process output as a clock delayed version of the process output.

Another embodiment of the invention includes a programmable logic array with a plurality of programmable logic blocks configured to be programmable for a variety of interconnections and a variety of functions. A SPE is operably coupled to at least some of the plurality of programmable logic blocks. The SPE includes a clock divider configured for dividing down a clock input to supply selectable independent divisor values for a delay chain clock, a coefficient clock, and a multiply clock. A forward delay chain is operably coupled to the delay chain clock and between a forward data input and a forward data output and is configured for generating a selectable forward tap at a rate of the coefficient clock. A reverse delay chain is operably coupled to the delay chain clock and between a reverse data input and a reverse data output and is configured for generating a selectable reverse tap at a rate of the coefficient clock. A coefficient buffer is operably coupled to the delay chain clock and is configured for circulating coefficients within the coefficient buffer and generating a coefficient output. An add/subtract unit is operably coupled to the delay chain clock and is configured for adding or subtracting the selectable forward tap and the selectable reverse tap to generate an intermediate output. A multiply unit is operably coupled to the multiply clock and is configured to multiply the intermediate output and the coefficient output to generate a process output. An output delay chain is operably coupled to the multiply clock and the process output and is configured for generating a delayed process output.

Yet another embodiment of the invention is a method that includes generating a selectable forward tap with a forward delay amount between a forward data input and a forward data output of a forward delay chain. A selectable reverse tap is generated with a reverse delay amount between a reverse data input and a reverse data output of a reverse delay chain. A coefficient output is generated from a coefficient buffer configured for circulating coefficients. The method also includes adding or subtracting the selectable forward tap and the selectable reverse tap to generate an intermediate output. The intermediate output and the coefficient output are multiplied to generate a multiply result. The multiply result and a process input are combined by bypassing, adding, or subtracting the process input with the multiply result to generate an accumulator result. The accumulator result is delayed by a programmable number of clock cycles to generate a process output.

DETAILED DESCRIPTION

Figure 1:
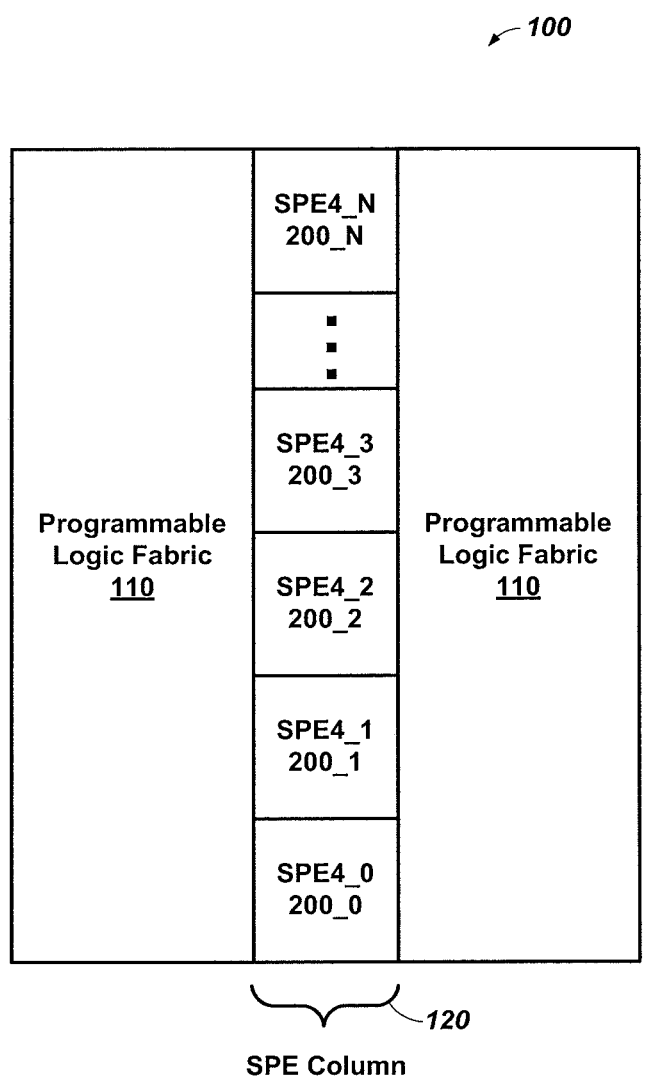
FIG. 1 illustrates a block diagram of a layout of a programmable logic array including signal processing engines (SPEs) according to an embodiment of the invention.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings, which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "assert" and "negate" may be respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Those of skill in the art would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

The term "programmable logic array" as used herein means an integrated circuit including a portion that can be reconfigured to perform different logic operations depending on how it is "programmed." Examples of programmable function elements are Configurable Logic Blocks (CLBs), Field-Programmable Gate Arrays (FPGAs), Programmable Logic Devices (PLDs), logic blocks, logic array blocks, macrocells, logic cells, and logic cell arrays.

While embodiments of the present invention are described in connection with programmable logic arrays, the methods and circuits described herein are not limited to programmable logic arrays. Many integrated circuits (ICs) may include one or more embodiments of the present invention, such as, for example an application specific integrated circuit (ASIC), an IC that includes a plurality of programmable function elements, an IC having a microprocessor, an IC having a Digital Signal Processor (DSP), an IC having a micro controller, and combinations thereof.

The term "custom" as used herein when referring to elements of a programmable logic array means a block of including circuit elements that are configured to perform a specific function with circuit elements that are laid out and interconnected with arrangements that differ from the standard layout and interconnect of the programmable array.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1).

Many of the circuits discussed herein include global signals such as clocks, clock enable signals, and a reset signal. Unless needed to discuss specific operation, these global signals may be omitted for clarity because the use thereof would be readily apparent to a person of ordinary skill in the art.

Embodiments of the present invention include a custom signal processor configured for flexibility to adapt to different applications and data characteristics. Some embodiments of the signal processor are configured for incorporation in a programmable logic array.

Digital signal processing is an important application for integrated circuits. In many applications, the exact parameters of the signal processing are not known at the time of manufacture and the integrated circuit needs to enable them as configurable by the user. In some applications, users may want to change the parameters as needed. An example of such scenarios is the cellular radio card application where multiple cellular standards (WCDMA, LTE, etc.) with varying signal processing parameters may need to be supported. Moreover, these standards evolve over time and the user may need to reprogram the parameters, even in the field. Therefore, there is need for a flexible signal processing architecture that can be configured and reconfigured for various functions while delivering the high performance and low power needed by applications. The architecture needs to achieve these goals while minimizing the silicon area used so that the resulting design is cost competitive.

Embodiments of the invention largely uses a systolic architecture for implementing FIR filters and other signal processing algorithms to provide a flexible and yet high-performance Digital Signal Processing (DSP) architecture in the context of programmable logic devices. While general-purpose programmable logic can implement signal processing functions, its efficiency (area, speed, power) at doing so is very low. Hence, the need to supplement the general-purpose fabric with specialized signal processing blocks. However, these signal processing blocks need to maintain flexibility so they do not compromise the flexibility of the programmable logic device. At the same time, the signal processing blocks need to achieve high efficiency on signal processing functions.

FIG. 1 illustrates a block diagram of a layout of a programmable logic array 100 including a Signal Processing Engine (SPE) column 120. As shown in FIG. 1, the SPE column 120 may includes one or more groups of four SPEs (200_1, 200_2, 200_3, 200_N) embedded within the programmable logic array 100. One or more such columns may be embedded in the programmable logic array. Of course, a column is an arbitrary orientation; embodiments of the present invention may also be configured with row orientations and differences in layout that will be apparent to a person of ordinary skill in the art. In addition, groupings of SPE engines other than four may be used.

A general-purpose programmable logic fabric 110 provides conventional programming as in many PLDs, such as FPGAs. As a non-limiting example, the programmable logic fabric 110 may include Programmable Logic Blocks (PLBs, not specifically shown) as a basic tile of the programmable logic array 100. Most programmable logic arrays 100 are constructed out of a tile block. A typical PLB may include within it one or more logical computation cells and a routing matrix that interconnects these cells to one or more cells in other PLBs.

Figure 2:
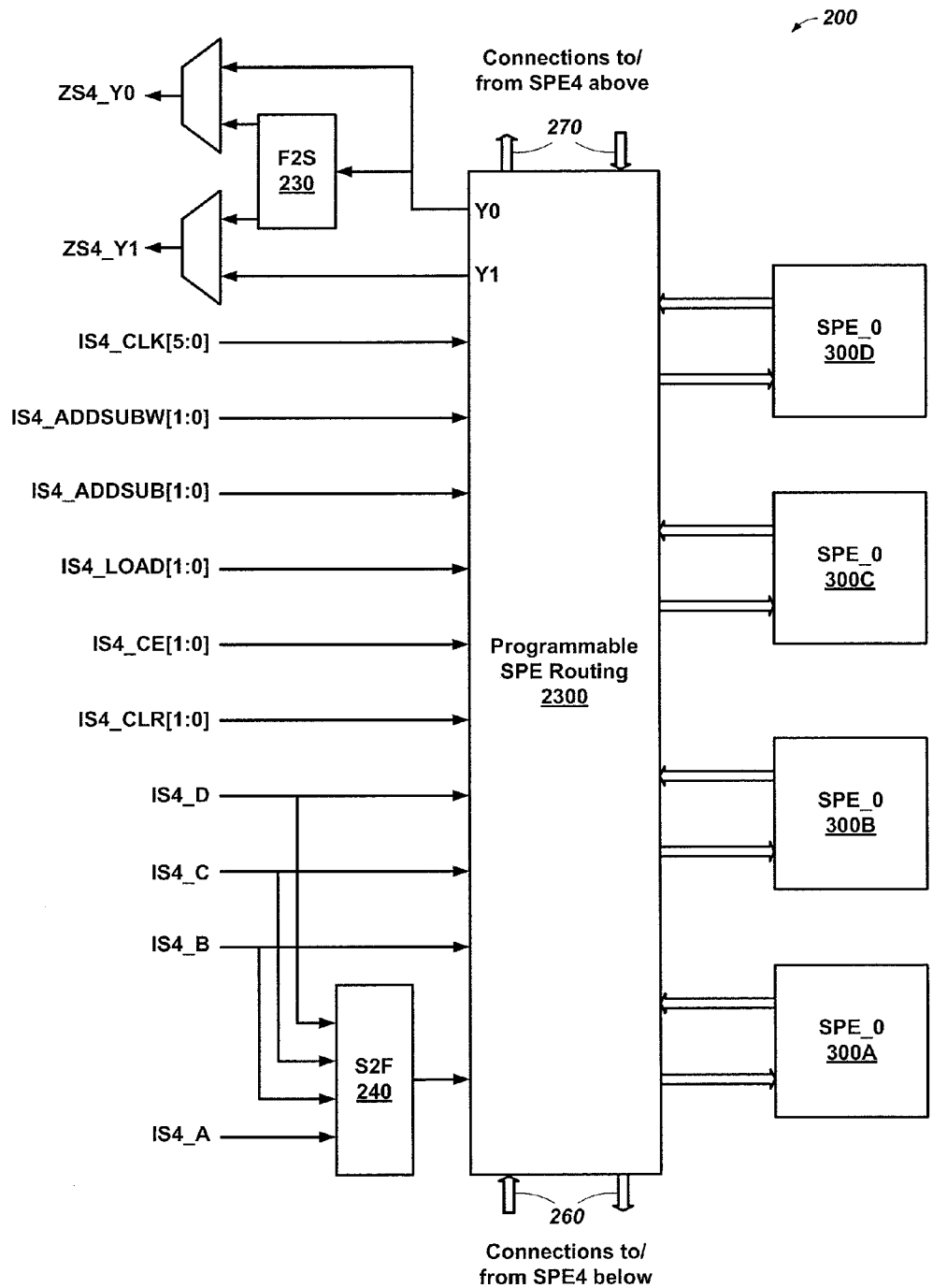
FIG. 2 is a simplified block diagram illustrating programmable SPE routing, according to an embodiment of the invention, for the SPEs and an example of how SPEs can be cascaded together to expand on the capabilities of the SPEs.

FIG. 2 is a simplified block diagram illustrating a group of four SPEs 200 and programmable SPE routing block 2300 for the SPEs (300A, 300B, 300C, 300D) and an example of how SPEs 300 can be cascaded together to expand on the capabilities of the SPEs.

Interconnectivity for the SPEs 300 may occur through interfaces to the programmable SPE routing block 2300. The programmable SPE routing block 2300 provides flexible routing of general-purpose programmable logic fabric 110 (FIG. 1) inputs and outputs to and from the SPEs 300. The programmable SPE routing block 2300 also provides neighbor-to-neighbor connections between nearby SPE 300 instances, which may be instrumental in constructing many filter functions. The programmable SPE routing block 2300 can also include cascaded connections to the programmable SPE routing block 2300 instances above 270 and below 260 of the illustrated programmable SPE routing block 2300 to provide relatively fast interconnection without use of the general-purpose programmable logic fabric 110 (FIG. 1), which generally may have lower performance.

Also shown are a Slow to Fast (S2F) block 240 and a Fast to Slow (F2S) block 230. The S2F block 240 may be configured basically as a multiplexer that can interleave multiple channels (e.g., IS4_A, IS4_B, IS4_C, and IS4_D) of input data into the SPE 300. This multiplexing is beneficial because for many systems the data sample rates may be slow compared to the peak speed at which the computation units of the SPE 300 can run. Using the S2F block 240, multiple channels of data can be streamed into the SPE 300 and the computation resources of the SPE 300 can be time-shared between the channels. Thus, the SPE 300 can be utilized at its peak performance and, consequently, the number of SPEs 300 required to implement a given application may be reduced. Alternatively, the multiple channels may be input directly to programmable SPE routing block 2300 for other functions or presentation to the SPEs 300. The S2F block 240 functionality may be implemented in the general-purpose programmable logic fabric 110 (FIG. 1) also. However, the general-purpose programmable logic fabric 110 usually cannot match the speed of the SPEs 300, which is also the speed at which the S2F block 240 needs to run.

The F2S block 230 de-multiplexes the high-speed multi-channel output of the SPEs 300 to send data into the general-purpose programmable logic fabric 110 (FIG. 1) at a reduced data rate. Again, having a dedicated block for this function helps because the general-purpose programmable logic fabric 110 may not be able to match the speed of the SPEs 300. The multiplexers with ZS4_Y0 and ZS4_Y1 as outputs may be used to bypass the F2S block 230. The use of the S2F block 240 and the F2S block 230 will be illustrated in more detail later in this document when discussing some of the example filter implementations. Further details of the programmable SPE routing block 2300 are discussed below with reference to FIGS. 23-27.

While illustrated as 4-to-1 and 1-to-2 combinations for the S2F block 240 and the F2S block 230, respectively, many other combinations of a different number of data channels may be used. Other signals shown in FIG. 2 are clocks, clock enables, resets, and control signals, the use of which will be described later or will be readily apparent to those of ordinary skill in the art. Furthermore, some embodiments of the inventions may be implemented without the programmable SPE routing block 2300, and the grouping of SPEs into 4, 2, or other numbers is optional and may vary for different embodiments of the invention.

Figure 3:
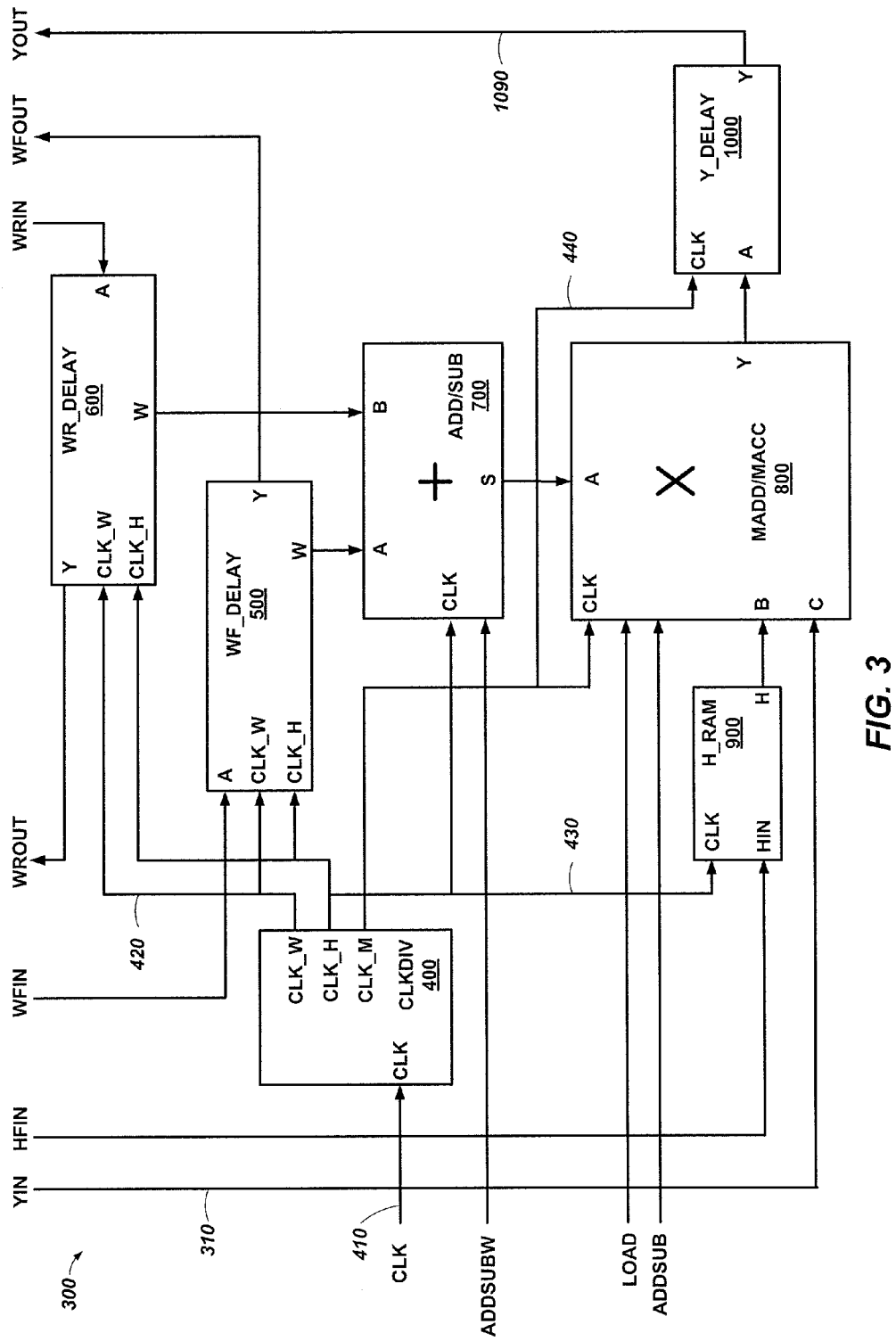
FIG. 3 is a simplified block diagram of a signal processing engine according to an embodiment of the invention.

FIG. 3 is a simplified block diagram of a signal processing engine (SPE) 300. The SPE 300 is configured in a systolic filter tap architecture that includes a delay tap on a forward delay chain 500 and a delay tap on a reverse delay chain 600. Outputs from the delay chains (500 and 600) may be cascaded to other delay chains (500 and 600) in other SPEs 300 to form long chains of pipelined data. A clock divider 400 uses a clock input 410 to generate a delay chain clock 420, a coefficient clock 430, and a multiply clock 440, the uses of which are explained in more detail below.

A selectable forward tap (W) from the forward delay chain 500 and a selectable reverse tap (W) from the reverse delay chain 600 can be optionally added or subtracted in an add/subtract unit 700. Results from the add/subtract unit 700 feed an A input of a multiply unit 800.

A coefficient buffer 900 includes various coefficient values that may be useful in performing a variety of signal processing functions, such as, for example, Finite Impulse Response Filters (FIRs). The output (H) of the coefficient buffer 900 feeds a B input of the multiply unit 800. A process input 310 also feeds the multiply unit 800 as a C input.

The multiply unit 800 may perform functions, such as, for example, multiplication, addition, subtraction, multiply-add, multiply-subtract, and multiply-accumulate on the A input, the B input, and the C input, as is explained more fully below.

An output (Y) from the multiply unit 800 feeds an output delay chain 1000, which may optionally add pipeline delays to a process output (i.e., output Y of the multiply unit 800) to generate a delayed process output 1090, which may feed additional SPEs 300 as the process input 310 or feed back into the programmable logic fabric.

The computational and structural configuration of the blocks making up an SPE 300 give the SPE 300 a distinct and more efficient architecture for performing many signal processing algorithms, such as, for example, digital filtering algorithms. Furthermore, in some embodiments, SPEs 300 can be tiled in an array to form a variety of signal processing circuits, especially Finite Impulse Response filters (FIRs). The control signals ADDSUBW, ADDSUB, and LOAD as well as the various clock signals are described below in the detailed description of the respective logic blocks they feed.

Figure 4:
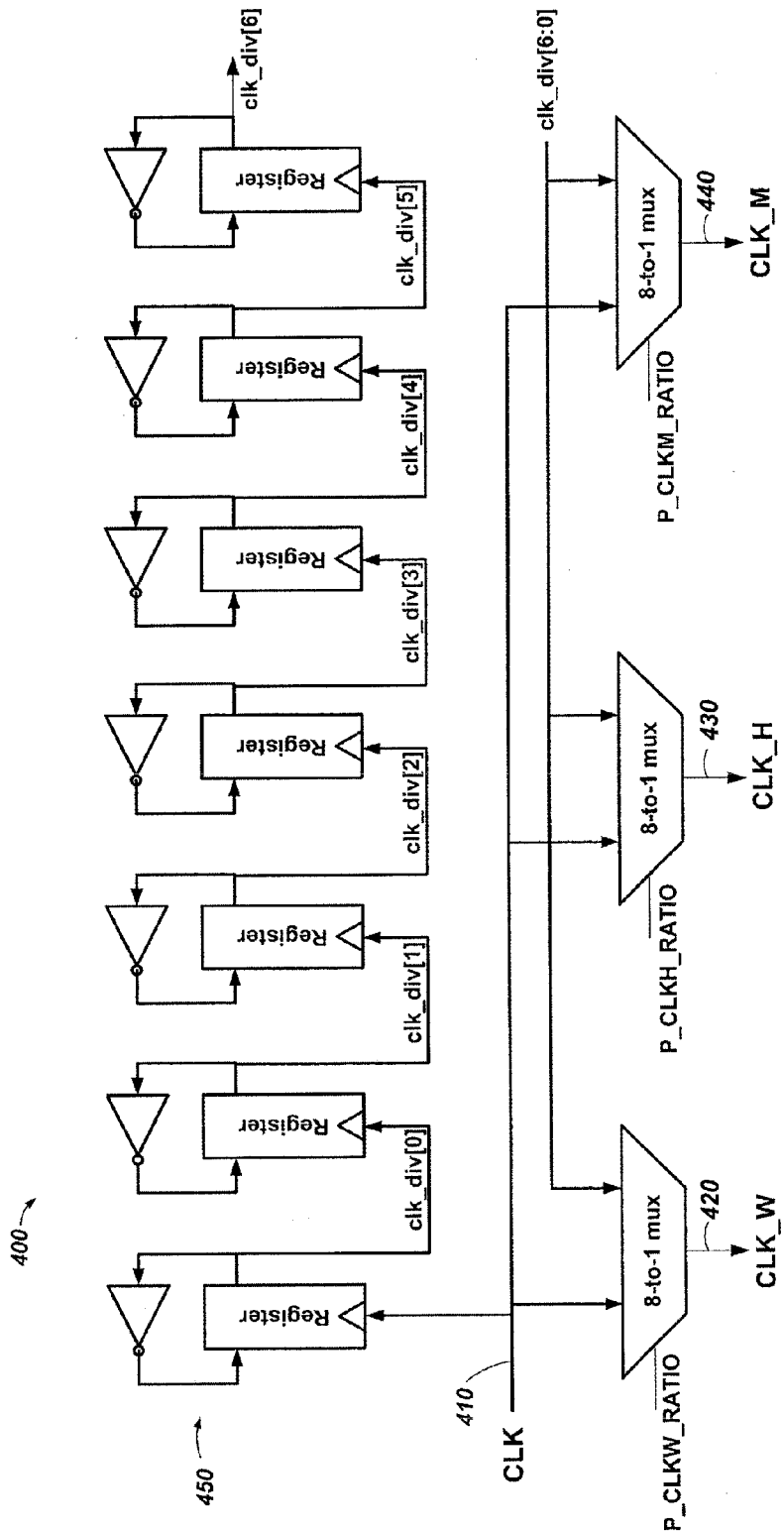
FIG. 4 is a simplified block diagram of a clock divider for use with an embodiment of the invention.

FIG. 4 is a simplified block diagram of a clock divider 400, which provides 3 independent clocks CLK_W (420), CLK_H (430), and CLK_M (440) from a single input clock CLK (410). Referring to both FIGS. 3 and 4, each of these three clocks may be configured as an independent division of the clock input 410. CLK_W is the data delay chain clock 420, which feeds the forward and reverse delay chains (500 and 600) and controls the rate at which data moves along these data delay chains. CLK_H is the coefficient clock 430 and controls the rate at which coefficients are read out of the coefficient buffer as well as the rate at which data samples are read out of the data delay taps (W) from the forward and reverse delay chains (500 and 600). CLK_M is the multiply clock 440 that controls the rate of operation of a multiplier in the multiply units 800, which is the largest, and consequently valuable, computational resource for optimization in performing signal processing algorithms. The multiply clock 440 may also control the operation of an adder/accumulator after the multiplier as well as the shift operations in the output delay chain 1000 since these outputs may need to be synchronized with the multiply and accumulate operations in the multiplier unit 800.

A clock divider 450 may be implemented as an N-bit ripple counter with the least significant bit clocked by the input clock 410. Each subsequent bit of the counter is then half the frequency of the previous bit to create a group of selectable independent divisor values. Three independent multiplexers use the bits of the ripple counter as inputs to enable the creation of three independent output clocks. Of course, other lengths of clock dividers and widths of multiplexers, as well as other clock-dividing configurations, may be used in embodiments of the invention.

Figure 5:
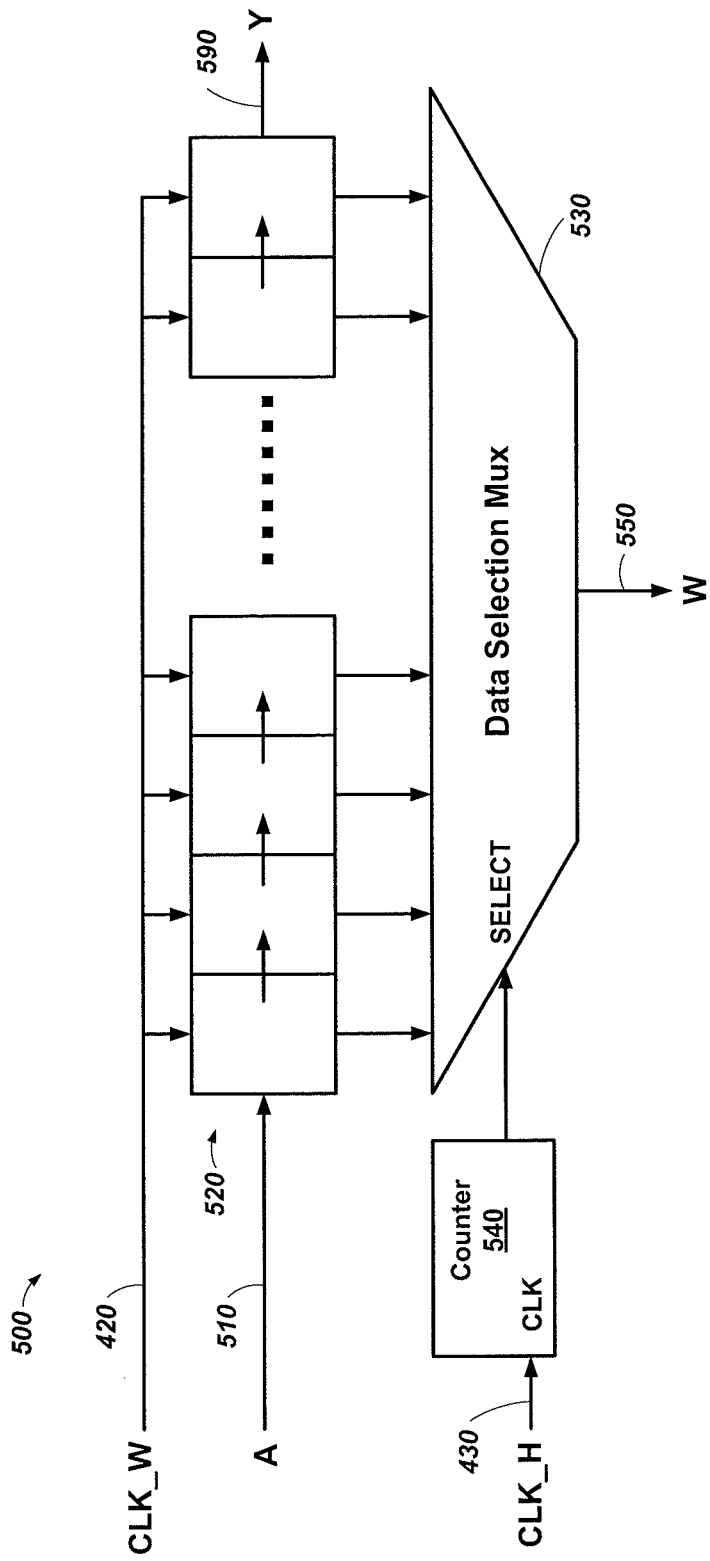
FIG. 5 is a simplified block diagram of a forward delay chain used in an SPE according to an embodiment of the invention.

FIG. 5 is a simplified block diagram of a forward delay chain 500 used in an SPE 300. A shift register 520 includes serially connected shift registers wherein each register may provide an input to a data selection multiplexer 530. The length of the shift register 520 may be configured with a parameter input (P_WF_DELAY) to define the number of delays in clock cycles between a forward data input 510 and a forward data output 590. Thus, the forward delay chain 500 length may be configurable based on needs of a particular signal processing application.

Selection of which input to present on the output of the multiplexer 530 is controlled by a configurable counter 540. As a non-limiting example, the counter 540 may be programmed with a minimum value, a maximum value, and a decrement/increment value (e.g., P_WF_CNTR_MAX, P_WF_CNTR_MIN, and P_WF_CNTR_DECREMENT). Thus, the counter 540 may be clocked to start with an initial value of P_WF_CNTR_MAX and count down to a value of less than or equal to P_WF_CNTR_MIN in steps of P_WF_CNTR_DECREMENT. The output of the counter 540 is a desired count value that selects a corresponding register of the shift register 520 in the multiplexer 530. Moreover, while the delay chain clock 420 operates the shift of the data along the forward delay chain 500, the parameter clock 430 operates the counter 540. This clock rate difference enables multiple or fractional data values to be sampled out of the shift register 520 based on the relative speeds of the two clocks. In addition, using the counter decrement allows flexibility in selecting which data values are sampled out of the shift register. As one non-limiting example, when the coefficient clock 430 is a multiple of the delay chain clock 420, a fast sampling of the input data stream is obtained at a selectable forward tap 550. Note that as shown in FIG. 5, a select value of 0 means that the forward data input 510 is selected with zero cycles of delay and the maximum value of the counter 540 (P_WF_CNTR_MAX) should be configured to be less than or equal to the length of the shift register 520 (P_WF_DELAY). As discussed below, this selecting different data values out of the shift register 520 allow for efficient mapping of filter algorithms on to an array of SPEs 300.

Figure 6:
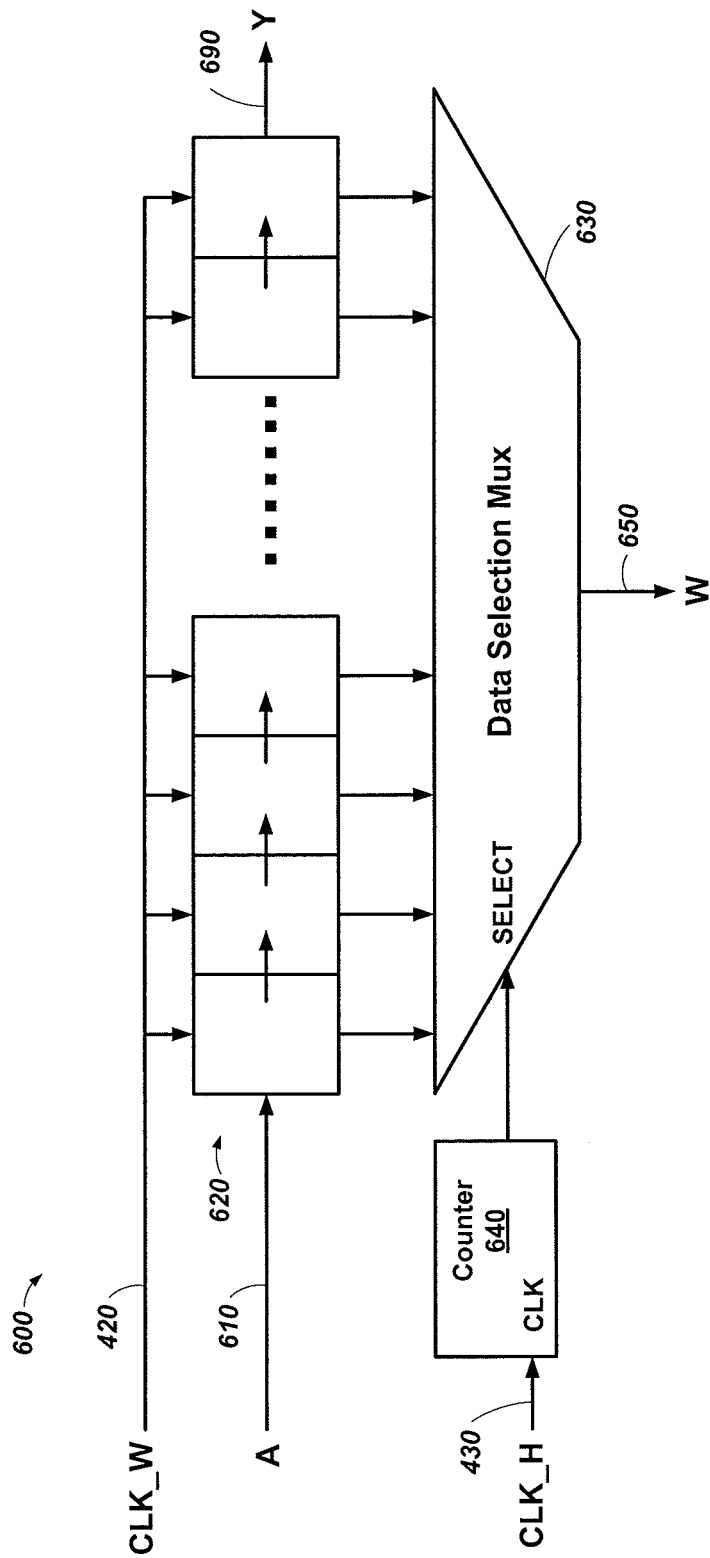
FIG. 6 is a simplified block diagram of a reverse delay chain used in an SPE according to an embodiment of the invention.

FIG. 6 is a simplified block diagram of a reverse delay chain 600 used in an SPE 300. In general, operation of the reverse delay chain 600 is similar to that of the forward delay chain 500 and the details need not be discussed again. However, in the reverse delay chain 600 of FIG. 6, a reverse data input 610 feeds a shift register 620 clocked by the delay chain clock 420 to produce a reverse data output 690 after a programmable length. In addition, a counter 640 selects the appropriate input for a multiplexer 630 to produce a selectable reverse tap 650.

Figure 7:
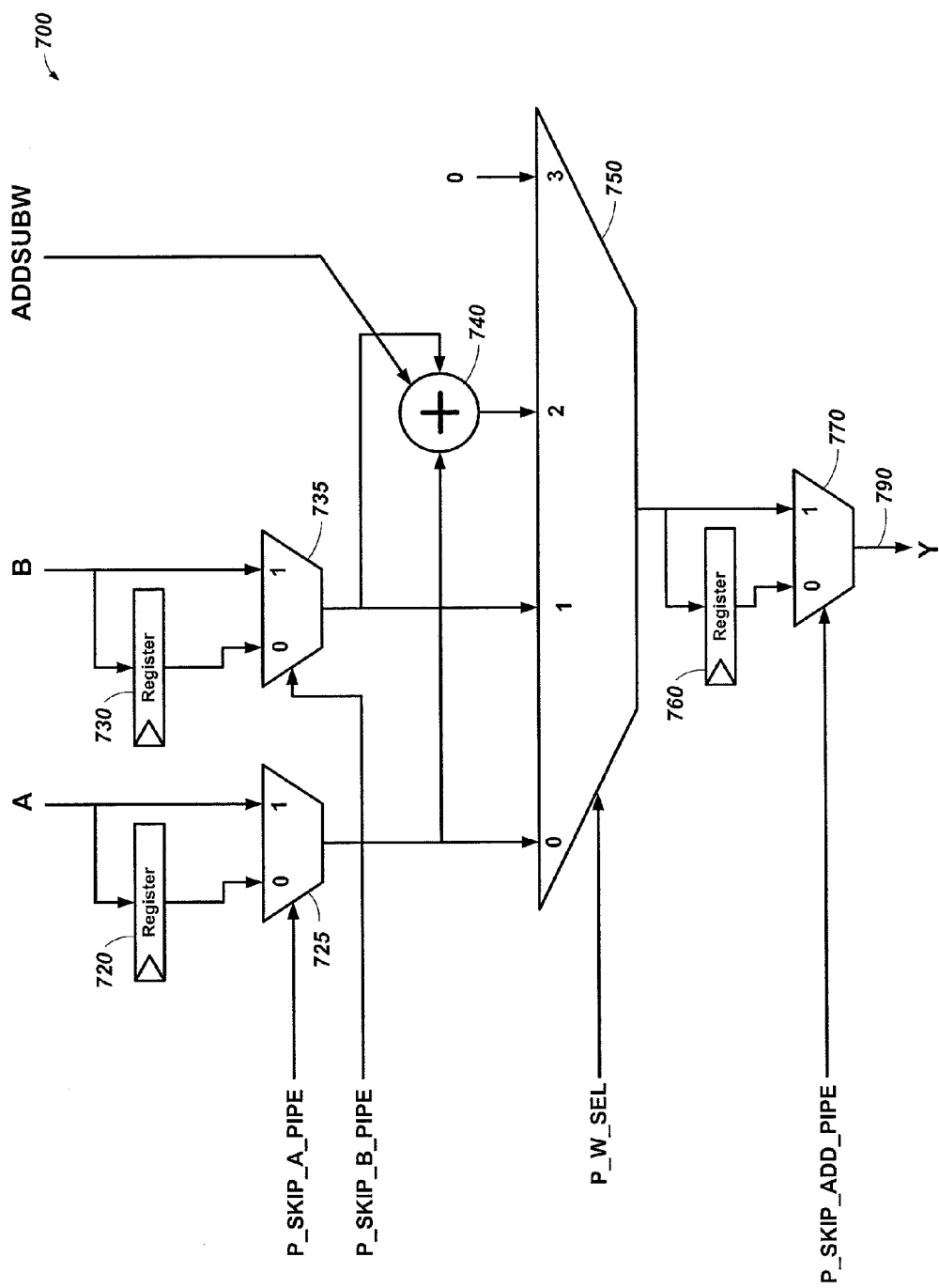
FIG. 7 is a simplified block diagram of an add/subtract unit used in an SPE according to an embodiment of the invention.

FIG. 7 is a simplified block diagram of an add/subtract unit 700 used in an SPE 300. The add/subtract unit 700 may be used to add or subtract the A input and the B input based on the control signal ADDSUBW, which controls the functions of an adder/subtractor 740.

A combination of register 720 and multiplexer 725 creates a bypassable pipeline register for the A input. In other words, a first addend for the adder/subtractor 740 may be the A input directly or may be the A input pipelined by a clock. Similarly, the B input includes a bypassable pipeline register created by register 730 and multiplexer 735 such that a second addend for the adder/subtractor 740 may be the B input directly or may be the B input pipelined by a clock. Configuration parameters P_A_SKIP_PIPE and P_B_SKIP_PIPE provide control for the optional bypassable pipeline registers.

A multiplexer 750, controlled by configurable parameter P_W_SEL, can be used to select whether input A, input B, the result from the adder/subtractor 740, or a zero value is selected for the output of the add/subtract unit 700. As with the inputs, register 760 and multiplexer 770 creates a bypassable pipeline register for the value to be sent out as an intermediate output 790 of the adder/subtractor 740.

Figure 8:
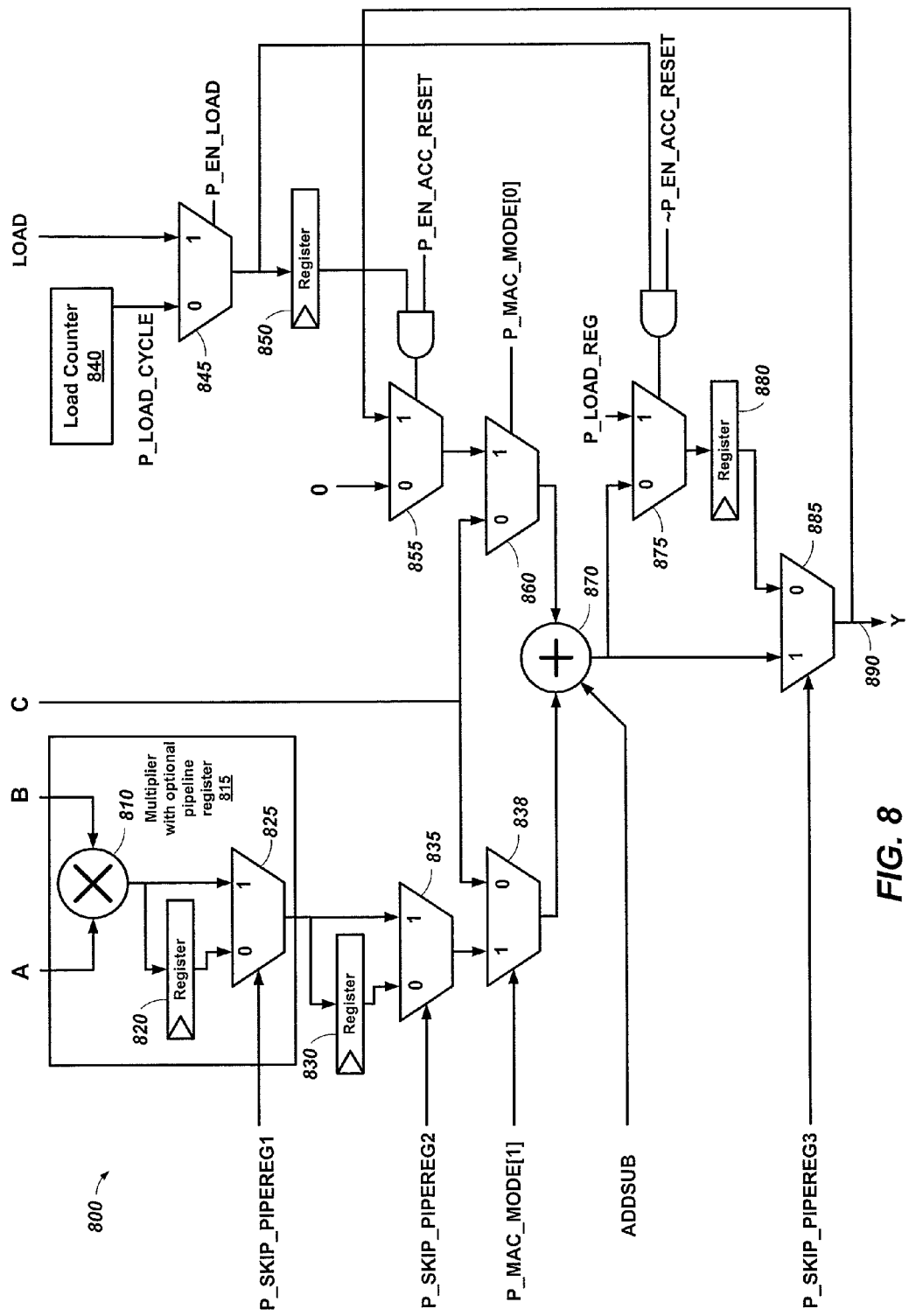
FIG. 8 is a simplified block diagram of a multiply unit used in an SPE according to an embodiment of the invention.

FIG. 8 is a simplified block diagram of a multiply unit 800 used in an SPE 300. The multiply unit 800 may perform functions, such as, for example, multiplication, addition, subtraction, multiply-add, multiply-subtract, and multiply-accumulate on the A input, the B input, the C input, and an accumulator feedback.

A multiplier with an optional pipeline register 815 includes a multiplier 810 to multiply inputs A and B, which come from the intermediate output 790 (FIG. 7) of the add/subtract unit 700 and the coefficient output 990 (FIG. 9) of the coefficient buffer 900, respectively. The output of the multiplier 810 is fed through an optional bypassable pipeline register comprised of register 820 and multiplexer 825.

An additional stage of pipelining may be useful for some algorithms and can be added with another optional bypassable pipeline register comprised of register 830 and multiplexer 835. Another optional bypass register forms a pipeline register configured to store an accumulator result in an accumulator register 880 and multiplexer 890.

An adder/subtractor 870 adds or subtracts the outputs of multiplexers 838 and 860 depending on the configuration input ADDSUB. The adder/subtractor 870 creates a mode for accumulation of multiplication values as well as adding a third term from input C.

In a non-limiting example embodiment, control of the arithmetic functions of the multiply unit 800 may be defined by the parameter P_MAC_MODE[1:0]. The P_MAC_MODE[1:0] signals control multiplexers 838 and 860 to create the following operations:

P_MAC_MODE=00: Generally, unused mode as the output equals 2° C. or 0 depending on whether the adder is set to add or subtract, respectively.

P_MAC_MODE=01: Accumulation mode for input C, which may generally be used as an adder chain input by cascading process inputs 310 (FIG. 3) and delayed process outputs 1090 (FIG. 3). This mode may be useful at the output of folded-in-time and multi-rate filter algorithms as discussed below.

P_MAC_MODE=10: Multiply-add mode with the output being (A*B)+C or (A*B)−C depending on whether the adder/subtractor 870 is configured to add or subtract respectively based on the configuration input ADDSUB. This mode is commonly used in systolic forms of filter algorithms. Systolic architectures typically provide the highest performance for many filter algorithms.

P_MAC_MODE=11: Accumulation mode for the multiplier output (A*B). In other words, the output of the arithmetic functions is (A*B)+Accumulator or (A*B)−Accumulator, depending on the configuration input ADDSUB, and wherein Accumulator=the value stored in register 880. This mode is useful for folded-in-time filter algorithms as discussed below.

In a unique way, the accumulation modes are provided with the ability to periodically load or reset the accumulator register 880 with a configurable period. The load functionality can be triggered either through configurable count parameter (P_LOAD_CYCLE) or through the LOAD input signal, which is enabled by asserting P_EN_LOAD. The value of P_LOAD_CYCLE may be generated by a load counter 840 as a number of clock cycles after which periodically the value in P_LOAD_REG is transferred into the accumulator. A value of zero for the P_LOAD_CYCLE disables the periodic load.

Mutually exclusive to the load functionality, the accumulator 880 can have a periodic reset. This reset clears the accumulation value stored in the accumulator without affecting the value at its input to start a new accumulation. For example, if the input to the accumulator (i.e., the output of the multiplier 870), or input P_LOAD_REG, based on P_MAC_MODE[0] is 5 and the value stored in the accumulator is 20 for the cycle in which the reset is activated, then the value of the accumulator in the next cycle will be the input 5 selected by multiplexer 875. The periodic accumulator reset is activated using the configurable parameter P_EN_ACC_RESET and its periodicity is set by P_LOAD_CYCLE. The periodic reset functionality is useful for implementation of folded-in-time and multi-rate filters.

The multiply unit 800 is operated using the multiply clock 440, which clocks the registers shown in FIG. 8 (for clarity, the connections are not shown). As a result, the clocking speed for the multiply unit 800 may be independent from coefficient clock 430, which controls the inputs (A, B, and C). This clocking difference enables the multiplier to sample its inputs one or more times and even skip samples if needed. Configurable parameters P_SKIP_PIPEREG1, P_SKIP_PIPEREG2, and P_SKIP_PIPEREG3 provide optional pipelining at different stages in the datapath to achieve high clock frequency.

Figure 9:
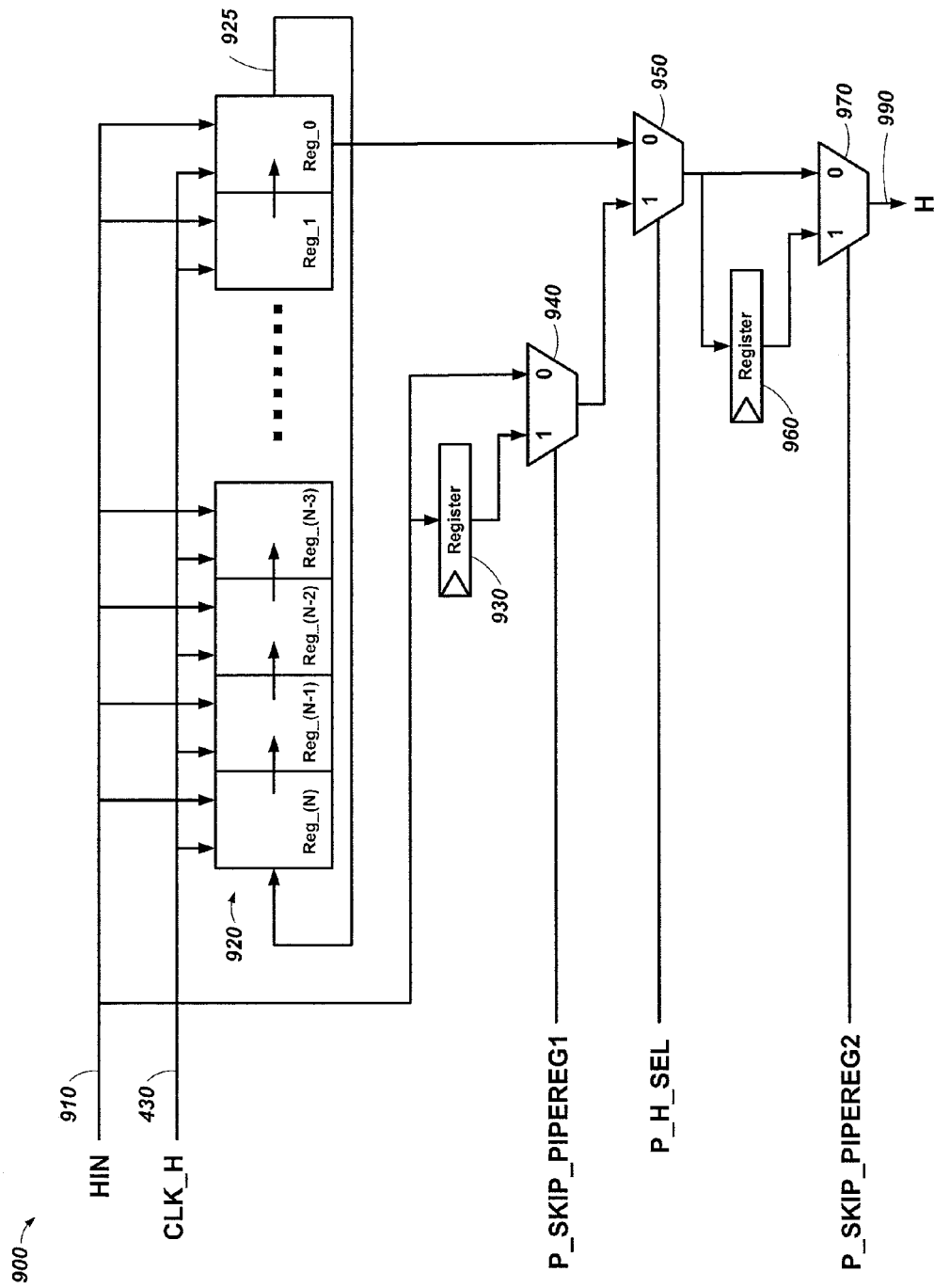
FIG. 9 is a simplified block diagram of a coefficient buffer used in an SPE according to an embodiment of the invention.

FIG. 9 is a simplified block diagram of a coefficient buffer 900 used in an SPE 300. In a unique way, the coefficient buffer 900 provides a circular buffer 920 to store one or more coefficients to be used in many signal processing functions, such as filter algorithms. The ability to rotate coefficients is useful in many folded-in-time and multi-rate filter algorithms. The length of the buffer 920 is configurable using a P_H_SHIFT parameter (not shown). Alternatively, the coefficient value can be fed through the HIN signal 910, which is coupled to the HFIN signal of the SPE 300, using the P_H_SEL parameter as the select on multiplexer 950. The HFIN signal of the SPE 300 may be driven by logic mapped into the programmable logic fabric or from other SPEs 300.

Optional bypassable pipeline registers are available at the HIN signal 910 and an output 925 of the circular buffer 920. A first bypassable pipeline register on the HIN signal 910 comprises register 930 and multiplexer 940 controlled by configurable parameter P_SKIP_PIPEREG1. A second bypassable pipeline register on the output of multiplexer 950 comprises register 960 and multiplexer 970 controlled by configurable parameter P_SKIP_PIPEREG2 and configured to generate the coefficient output 990.

In some embodiments, each register of the circular buffer 920 may include circuitry (not shown) to load a coefficient to that register. Alternatively, the circular buffer 920 may be "primed" by shifting coefficients down through the buffer using the HIN signal 910 starting at REG_N until the circular buffer 920 is loaded as desired, and then the feedback signal 925 may be enabled as the input to REG_N.

Figure 10:
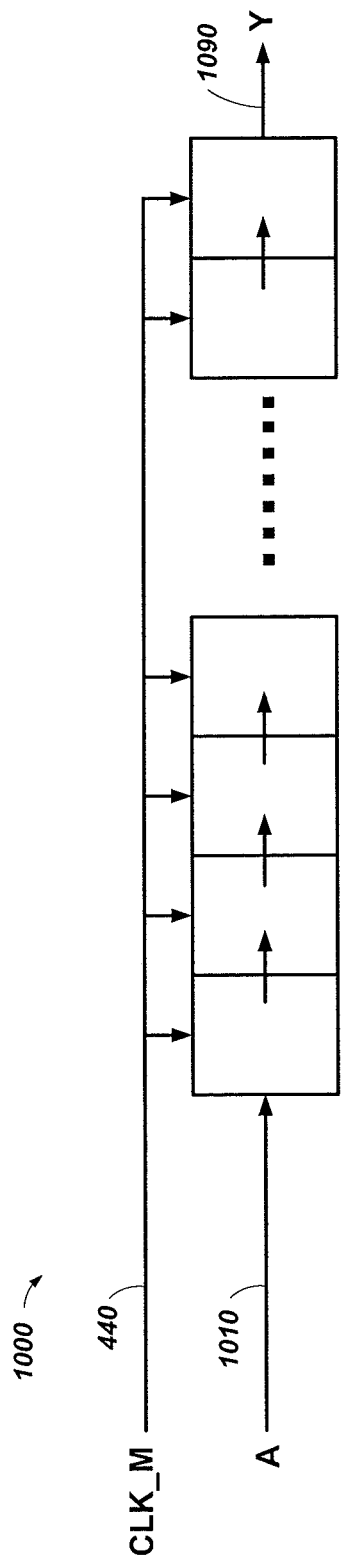
FIG. 10 is a simplified block diagram of an output delay chain used in an SPE according to an embodiment of the invention.

FIG. 10 is a simplified block diagram of an output delay chain 1000 used in an SPE 300. The output delay chain 1000 may be useful for pipelining the output along an adder chain. When adding pipeline delay in the output delay chain 1000, a corresponding delay may be used in the forward and reverse data delay chains (500 and 600, FIG. 3) to preserve the logical functionality of the algorithm being implemented. The output delay chain 1000 can delay the output 1090 of the multiply unit 900 relative to an input 1010 of the multiply unit 900 for zero or more cycles of the multiply clock 440. Multiple cycles of pipeline delay may be needed when the multiply clock 440 is a multiple of the delay chain clock 420 as is the case for many multi-rate filter algorithms. In such a case, (pipeline delay added to output delay chain 1000 divided by the pipeline delay added to the delay chains 500 and 600 equals the multiply clock 440 divided by the delay chain clock 420. In other words, using names defined in FIG. 3, (pipeline delay added to Y_DELAY/pipeline delay added to WF_DELAY, WR_DELAY)=(CLK_M/CLK_W).

FIG. 11A-11F are simplified block diagrams illustrating various possible configurations of an SPE to perform different signal processing functions. The block diagrams are simplified versions of the complete SPE 300 shown in FIG. 3 to show the basic functions of the forward delay chain, the reverse delay chain, the output delay chain, the coefficient input to the multiplier, the adder/subtractor in the add/subtract unit 700, the multiplier in the multiply unit 800, and the adder/subtractor in the multiply unit 800. These diagrams give an easy depiction of operation that may be performed when SPEs are cascaded together to perform various signal processing algorithms. The absence of functional blocks in any of these depictions A-F does not necessarily mean that the circuitry is not present. Rather, it means that any circuitry of the absent functional blocks may not be needed for the specific operations currently configured for the SPE 300.

Figure 11:
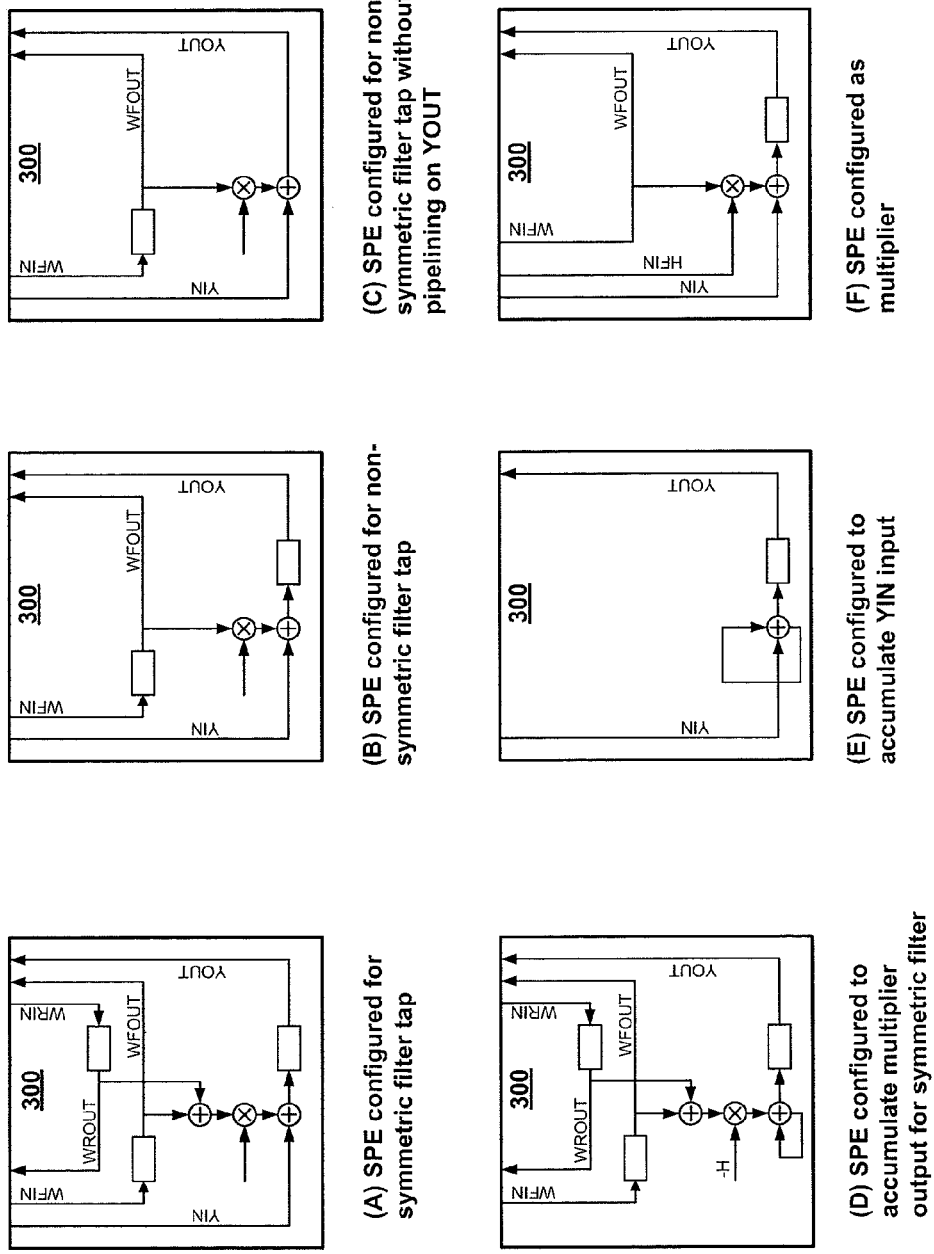
FIGS. 11A-11F are simplified block diagrams illustrating various possible exemplary configurations of an SPE to perform different signal processing functions.

In FIG. 11A, all of the basic functions are illustrated, which may be useful for symmetric filter tap algorithms. In FIG. 11B, which may be useful for non-symmetric filter tap algorithms, the reverse delay chain and the first adder/subtractor may not be used. In FIG. 11C, which may be another useful embodiment for non-symmetric filter tap algorithms, the reverse delay chain, the first adder/subtractor, and the output delay chain may not be used. In FIG. 11D, the second adder/subtractor is used as an accumulator rather than using the YIN input signal. In FIG. 11E, the second adder/subtractor may be used as an accumulator for the YIN input signal. The output delay chain may provide output data from the accumulations. In FIG. 11F, the multiplier multiplies the WFIN data and the HFIN data, and the YIN data may be added or subtracted from the multiply result. The output delay chain may provide output data from the second adder/subtractor.

Figure 12:
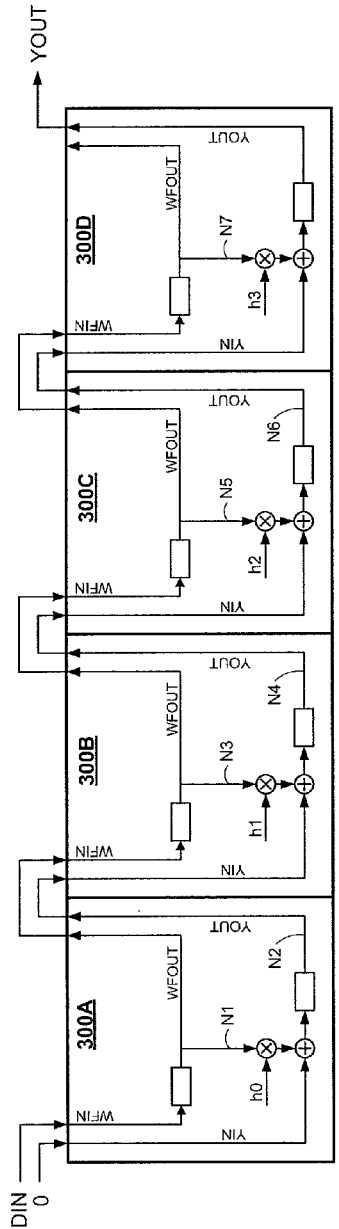
FIG. 12 is a simplified block diagram of SPEs cascaded together to form a finite impulse response filter (FIR) according to an embodiment of the invention.

FIG. 12 is a simplified block diagram of SPEs (300A, 300B, 300C, and 300D) cascaded together to form a single-rate finite impulse response filter (FIR) with four coefficients comprising h0 in SPE 300A, h1 in SPE 300B, h2 in SPE 300C, and h3 in SPE 300D. Below each SPE 300 is a box indicating how configurable parameters for each of the SPEs may be set to perform the designated function. Below the parameter boxes is the equation being implemented by the cascaded SPEs 300. Below the equation is a timing chart indicating the computational values of various nodes (N1-N7) in the chain made up of the SPEs 300 at different clock cycles during the process. Note that for this diagram, higher clock cycle numbers means later in time while lower data sample indexes means later in time. All three clocks CLK_W, CLK_H, and CLK_M may be the same frequency in this case and one output sample may be generated per clock.

The cascading is produced by the interconnections shown above the SPEs 300 wherein the initial YIN chain value is set to 0 and DIN values are input on the WFIN chain. The forward delay chain is formed by coupling WFOUT signals to WFIN signals to the next SPE 300. Similarly, process results are fed forward by coupling YOUT signals to YIN signals of the next SPE 300. The final process result is available, delayed by the appropriate number of clocks, at the YOUT signal of the final SPE 300D.

Figure 13:
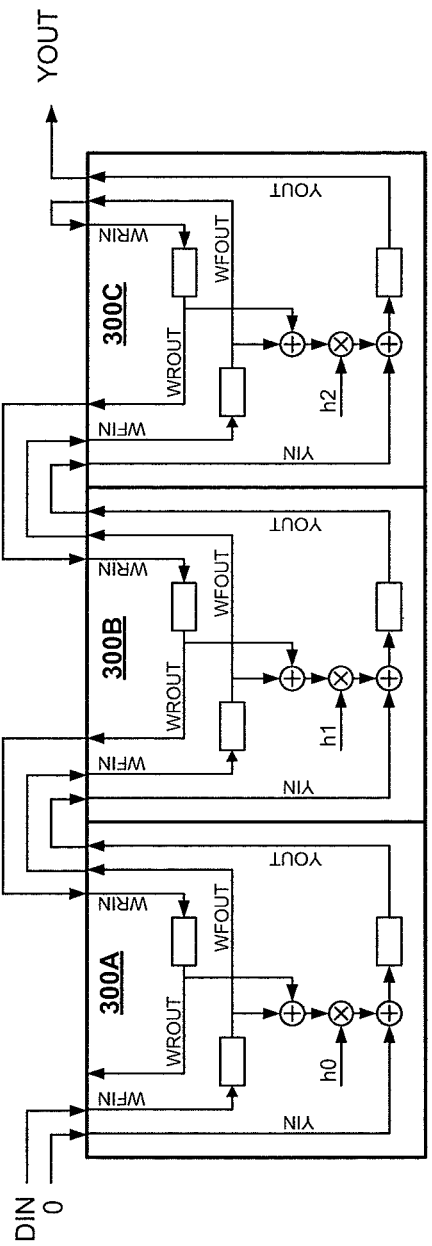
FIG. 13 is a simplified block diagram of SPEs cascaded together as another example of an FIR using the reverse delay chain.

FIG. 13 is a simplified block diagram of SPEs (300A, 300B, and 300C) cascaded together as another example of an FIR using the reverse delay chain. FIG. 13 shows how the reverse data delay chain of the SPE 300 can be used to fold the FIR circuit into half, thereby reducing the number of valuable multipliers (i.e., multipliers within SPEs) needed for the FIR. In this example, a single rate FIR with five coefficients is implemented using 3 SPEs. The symmetry of the coefficients is taken advantage of by adding the related data samples from the forward and reverse delay chains and then multiplying by the common coefficients stored in the H_RAM coefficient buffer. All three clocks, CLK_W, CLK_H, and CLK_M may be the same frequency in this case. Below each SPE 300 is a box indicating how configurable parameters for each of the SPEs 300 may be set to perform the designated function. Detailed timing for various nodes is not shown in this and the following example configurations.

The cascading is produced by the interconnections shown above the SPEs 300 wherein the initial YIN chain value is set to 0 and DIN values are input on the WFIN chain. The forward delay chain is formed by coupling WFOUT signals to WFIN signals to the next SPE 300. Similarly, process results are fed forward by coupling YOUT signals to YIN signals of the next SPE 300. The reverse delay chain is formed by coupling WROUT signals to WRIN signals of the previous SPE 300 in the chain. The final process result is available, delayed by the appropriate number of clocks, at the YOUT signal of the final SPE 300C.

Figure 14:
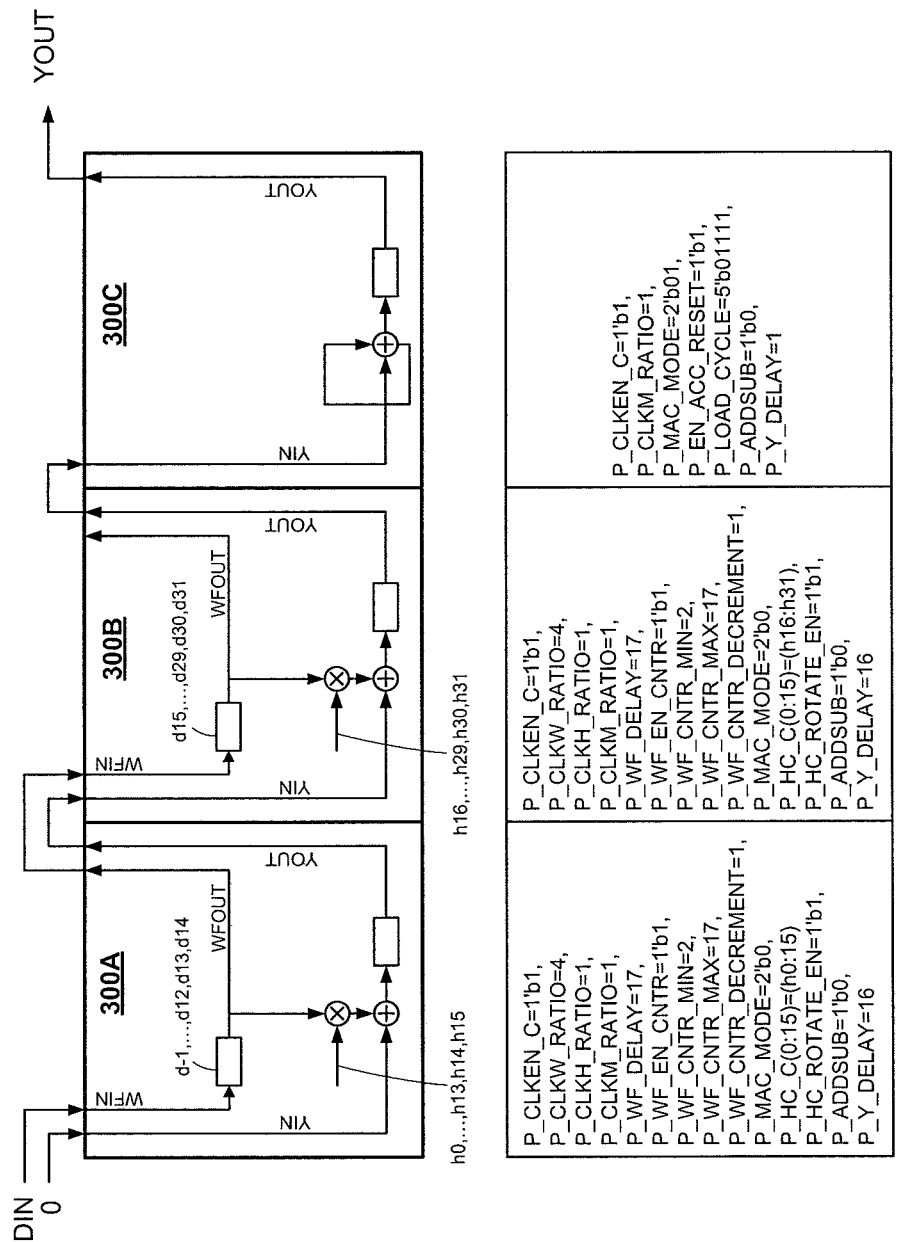
FIG. 14 is a simplified block diagram of SPEs cascaded together as another example of a 32 coefficient FIR using two SPEs wherein the multipliers run at 16 times the data sample rate and a third SPE is used as an accumulator.

FIG. 14 is a simplified block diagram of SPEs (300A, 300B, and 300C) cascaded together as an example of a 32 coefficient FIR. This example illustrates how a folded-in-time filter can be implemented using the SPEs (300). In this example, a filter with 32 coefficients is implemented using only 2 SPEs (300A and 300B) running the multiplier clock and coefficient clock (CLK_M and CLK_H) 16 times faster than the data chain clock (CLK_W). The data delay taps in the data chains of the SPEs store 16 samples of data. The forward delay chain is able to sample these 16 samples of data within one data clock cycle (CLK_W) since its counter is operated by the coefficient clock (CLK_H) running at 16 times the delay chain clock. For coefficients, the first 16 coefficients (h0-15) are stored in the first SPE 300A and the last 16 coefficients (h16-h31) are stored in the second SPE 300B. The output from 16 cycles of multiply-add operations are accumulated by an additional SPE (300C) configured to accumulate its adder-chain input (e.g., using P_MAC_MODE=01). This SPE (300C) resets its accumulator periodically every 16 cycles using P_LOAD_CYCLE. The output of this SPE (300C) at every 16th cycle of accumulation forms the output of the filter.

The cascading is produced by the interconnections shown above the SPEs 300 wherein the initial YIN chain value is set to 0 and DIN values are input on the WFIN chain. The forward delay chain is formed by coupling WFOUT signals to WFIN signals to the next SPE 300. Similarly, process results are fed forward by coupling YOUT signals to YIN signals of the next SPE 300. The final process result is available, delayed by the appropriate number of clocks, at the YOUT signal of the final SPE 300C.

Figure 15:
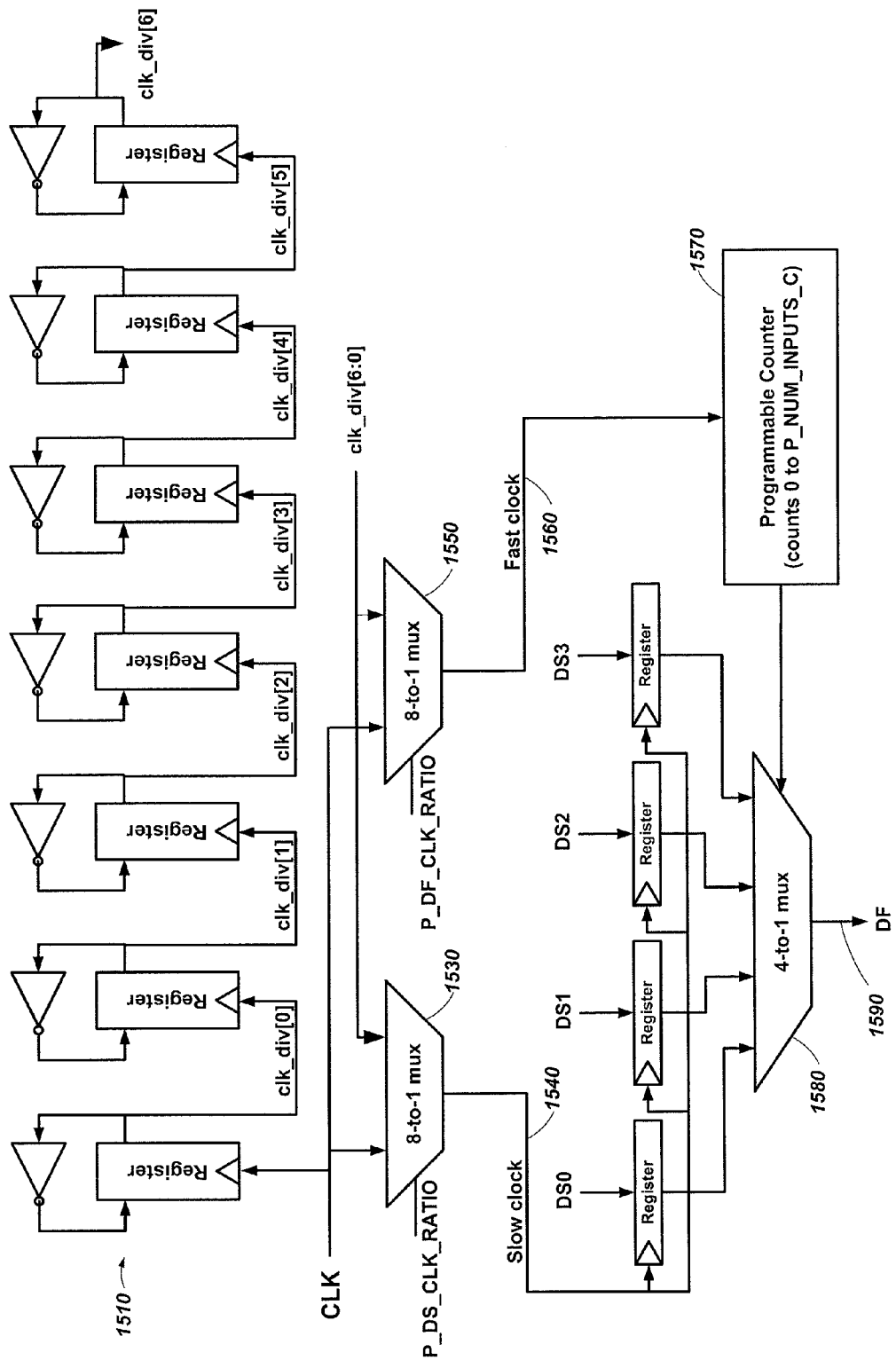
FIG. 15 is a simplified logic diagram of a circuit for performing serial to interleaved channel data conversions according to a particular embodiment of the invention.

FIG. 15 is a simplified logic diagram of a circuit for performing serial to interleaved channel data conversions as the S2F block illustrated in FIG. 2. One or more instances of this circuit may be provided in the SPE column. The S2F may be configured as a dedicated circuit for interleaving multiple channels of data into the FIR circuit implemented using the SPEs 300. As shown later in this document, multi-channel FIRs implemented using SPEs 300 use a channel interleaved data stream. The inputs to the S2F can be routed through the programmable logic fabric and the output of the S2F can be routed to a SPE input.

The S2F includes a clock divider circuit 1510, which may be similar to that of the SPE 300 so that it can operate at various fractions of the input clock and thereby reduce the number of global clocks needed in the design. The input data is registered using a "slow clock" 1540 set by parameter P_DS_CLK_RATIO on multiplexer 1530. The registered data (DS0, DS1, DS2, and DS3) is sampled into an output bitstream 1590 using a multiplexer 1580. A "fast clock" 1560 is generated at a frequency set by parameter P_DF_CLK_RATIO on multiplexer 1550. The select value of multiplexer 1580 is driven by a configurable counter 1570, wherein the parameter P_NUM_INPUTS_C May be used to select input channels DS0 through D[P_NUM_INPUTS_C] in sequence for the output bitstream 1590. In the example shown, P_NUM_INPUTS_C equal 4, but many other possible number of bitstreams may be used.

Figure 16:
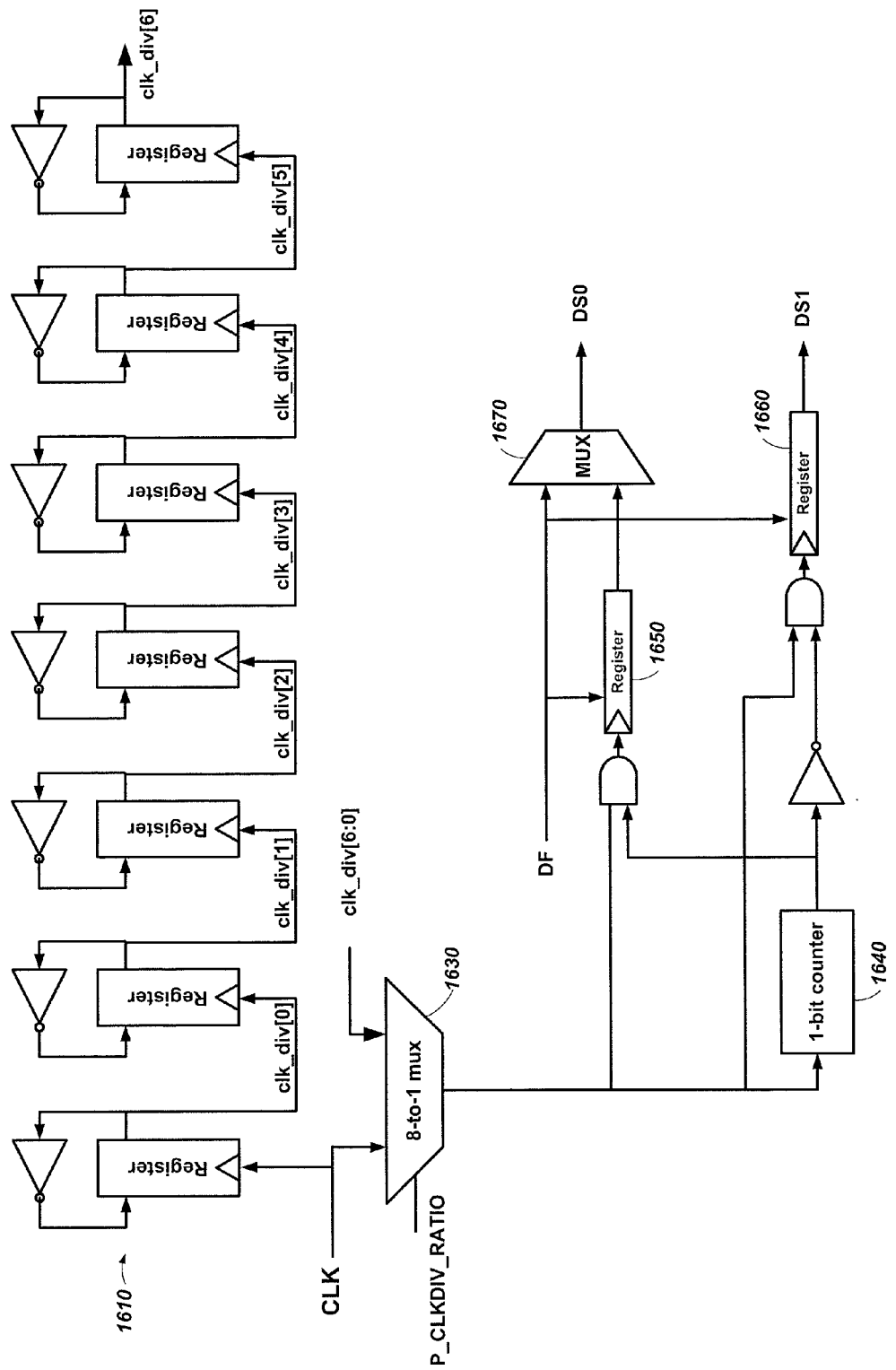
FIG. 16 is a simplified logic diagram of a circuit for performing interleaved channel data to serial conversions according to another embodiment of the invention.

FIG. 16 is a simplified logic diagram of a circuit for performing interleaved channel data to serial conversions as the F2S block illustrated in FIG. 2. One or more instances of this circuit may be provided in the SPE column. The F2S may be configured as a dedicated circuit for de-interleaving multiple channels of data at the output of a FIR implemented using the SPEs 300. Multi-channel FIRs implemented using SPEs 300 use a channel interleaved data stream as input and the output samples may also be in interleaved form.

The F2S has a clock divider circuit 1610, which may be similar to that of the SPE 300 so that it can operate at various fractions of the input clock and thereby reduce the number of global clocks needed in the design. A 1-bit counter 1640 operates at a "fast clock" frequency selected by multiplexer 1630 controlled by input parameter P_CLKDIV_RATIO. The "fast clock" typically may be set to match the multiplier clock (CLK_M) of the FIR circuit. The output of the 1-bit counter 1640 may be used to mark even and odd cycles of the clock. On even cycles, the input is transferred to output DS0 and on odd cycles to DS1. The output at DS0 can be optionally registered with register 1650 and multiplexer 1670 creating the option, whereas DS1 is always registered with register 1660.

While such de-interleaving logic can be implemented in the programmable logic fabric 110 too, the filter output is typically at full speed to maximize its efficiency and such speeds might be difficult for the programmable logic fabric 110 to obtain thereby slowing down the entire filter circuit. The example F2S shown in FIG. 16 is for a 2-to-1 de-interleaving. However, other de-interleaving amounts, such as, for example, 4-to-1 and 8-to-1 may be used. One the other hand, once the data rate is low enough for the programmable fabric to handle, additional de-interleaving may be accomplished in the programmable fabric to free up the routing resources in the programmable SPE routing block 2300 (FIG. 2).

Figure 17:
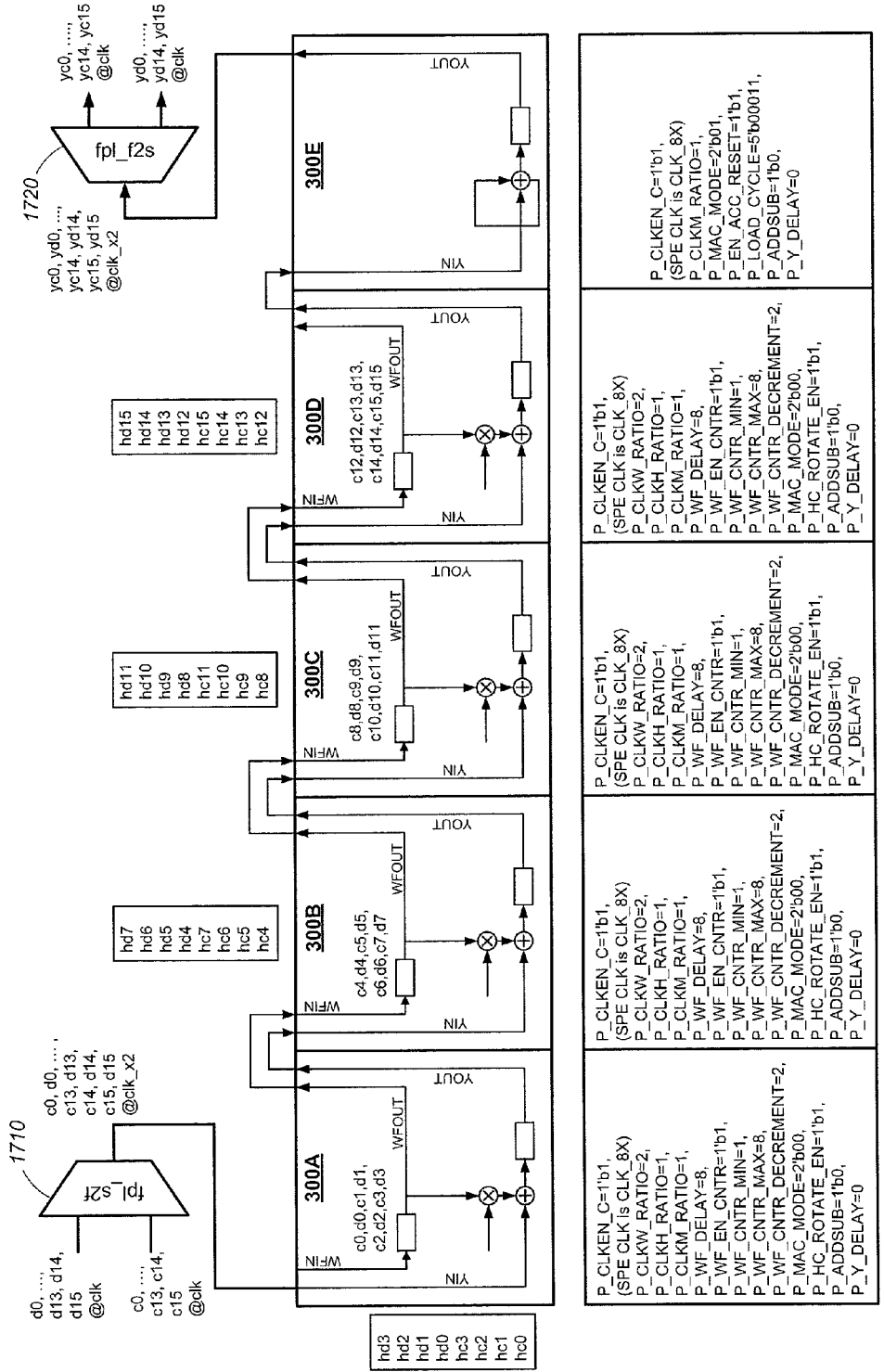
FIG. 17 is a simplified block diagram of SPEs cascaded together including interleaved channel to serial conversion and serial to interleaved channel conversion according to an embodiment of the invention.

FIG. 17 is a simplified block diagram of SPEs (300A, 300B, 300C, 300D, and 300E) cascaded together including interleaved channel to serial conversion and serial to interleaved channel conversion. FIG. 17 shows how a multi-channel, folded-in-time filter can be implemented using SPEs 300. In this example, two filters with 16 coefficients needed for two data channels (C and D) are implemented using 4 SPEs (300A, 300B, 300C, and 300D)) by running the coefficient and multiplier clocks in the SPE at 8 times the data sample rate for the forward delay chain. In contrast, a non-folded, non-shared implementation would take 16*2=32 SPEs 300.

At the input to the FIR structure, an S2F circuit 1710 is used to interleave the data samples from the two channels (c0, c1, c2, ... and d0, d1, d2, ... ). Clocks for input and output data of S2F are configured using the P_DS_CLK_RATIO and P_DF_CLK_RATIO parameters, which for this example would be set to be in an 2-to-1 ratio to interleave two data channels In this case, the input clock to the S2F is the same as the input clock to the SPE and is hence 8 times faster than the data sample rate and 4 times faster than the interleaved data sample rate. Hence for this example, and referring to FIG. 15, P_DS_CLK_RATIO=3'b111 and P_DF_CLK_RATIO=3'b010. Using the WF_DELAY delay tap, 8 samples of the interleaved data stream are stored in each SPE (300A, 300B, 300C, and 300D). Since the CLK_H and CLK_M in the SPE are 4 times faster than the rate of data shift through WF_DELAY, 4 product terms can be accomplished in the multiplier for each snapshot of data in the forward delay chain. The coefficients are stored in the circular buffer in H_RAM and aligned with their respective data samples. The coefficient values are illustrated in boxes next to their respective SPEs 300 as (hc0-hc15 and hd0-hd15).

An additional SPE 300E is configured as an accumulator at the output of the FIR structure and it resets periodically every 4 cycles of CLK_M. The accumulated value in each of these 4 cycles corresponds to one output term of the FIR for one channel. Since the output term is alternatively for each channel, the output stream of the accumulator is then de-multiplexed using an F2S circuit 1720 to separate the channel outputs. The design as shown is not pipelined but can be done so for performance by adding appropriate delay values to P_WF_DELAY and P_Y_DELAY.

Figure 18:
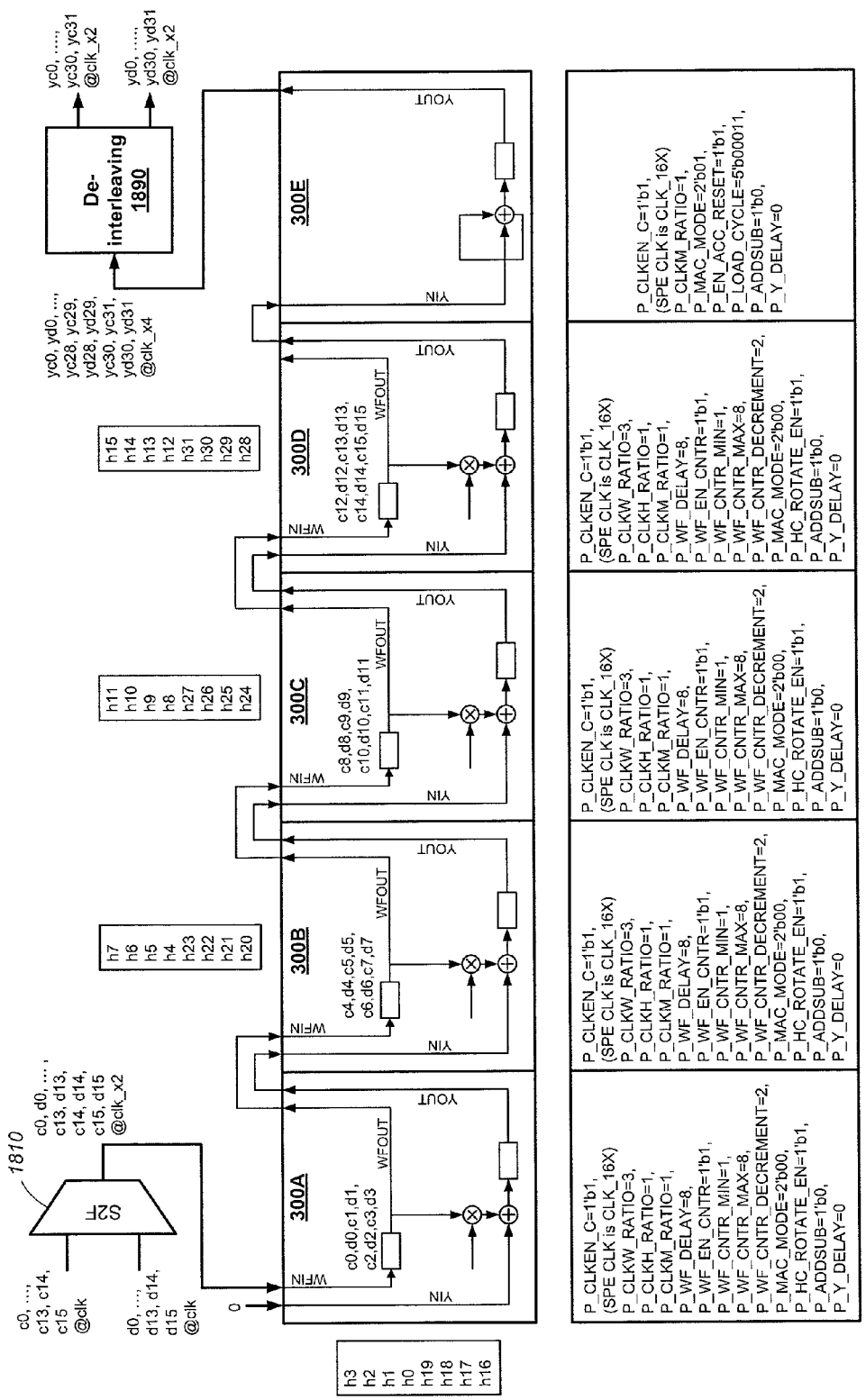
FIG. 18 is a simplified block diagram of SPEs cascaded together including interleaved channel to serial conversion and serial to interleaved channel conversion in an upsampling FIR according to an embodiment of the invention.

FIG. 18 is a simplified block diagram of SPEs (300A, 300B, 300C, 300D, and 300E) cascaded together including interleaved channel to serial conversion and serial to interleaved channel conversion in an upsampling FIR. FIG. 18 shows how an interpolation filter with folded-in-time taps and multi-channel data can be implemented using SPEs 300. In this example, the upsampling rate is 2 and there are 2 channels of data (C and D) with 32 common coefficients. The FIR is folded-in-time so that only 4 SPEs (300A, 300B, 300C, and 300D) are used by running the coefficient and multiplier clocks at 16 times the data sample rate. An S2F circuit 1810 is used to interleave the data from the two channels so that the input to the FIR structure is at twice the data sample rate. Since the coefficient rotation and multiplier are at 16 times the data sample rate, 8 product terms are possible in each SPE for a given snapshot of the data delay chain. Since two output samples are needed per input data sample, 4 product terms per output sample are created within this data snapshot. As shown in boxes near each of their respective SPEs 300, the coefficients (h0-h31) are aligned with the data to create the necessary terms of the filter equation. An additional SPE 300E is used at the output of the FIR to periodically accumulate 4 cycles of data corresponding to one output sample. The data output is interleaved and needs logic beyond that in the F2S to perform the de-interleave function. Therefore, a de-interleave block 1890 may be formed by appropriate mapping in the programmable logic fabric.

As shown in the above examples, the SPE array is capable of implementing a wide variety of filters of varying size with high performance. The performance level is equivalent to application-specific integrated circuits (ASICs) since the filter algorithms are mapped into the SPEs 300 without leaving any significant timing paths within the programmable logic fabric.

Figure 19:
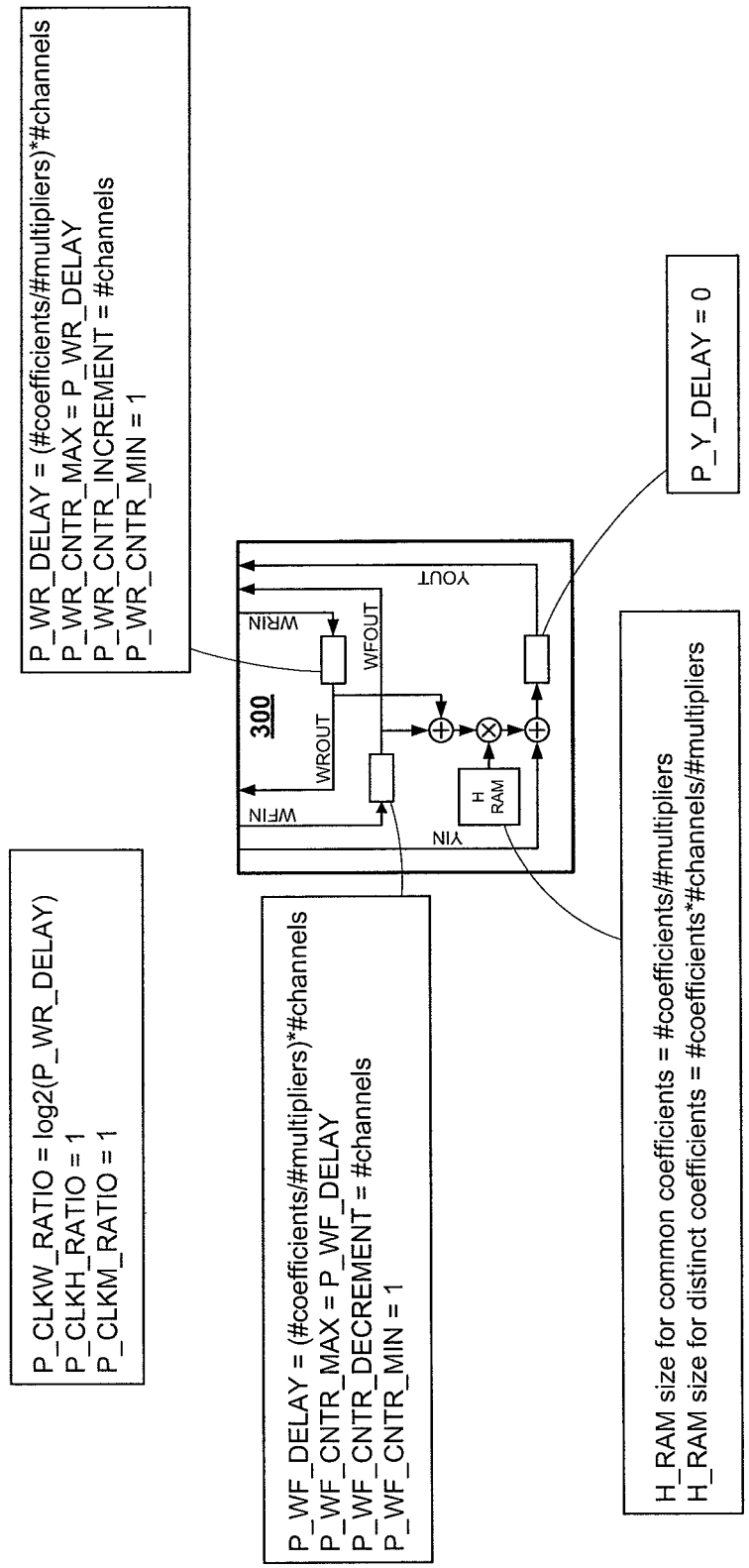
FIG. 19 is a simplified block diagram of an exemplary SPE showing some computation examples for a typical case.

FIG. 19 is a simplified block diagram of the SPE 300 showing some computation examples for a typical case and serves as a guide to determining the parameter values to be configured in the SPE 300 based on the filter parameters. These general expressions enable the construction of a software "wizard" to automatically generate the SPE configuration from user specified filter parameters. The parameters and values shown in FIG. 19 are self-explanatory to a person of ordinary skill in the art and need not be discussed in detail.

Figure 20:
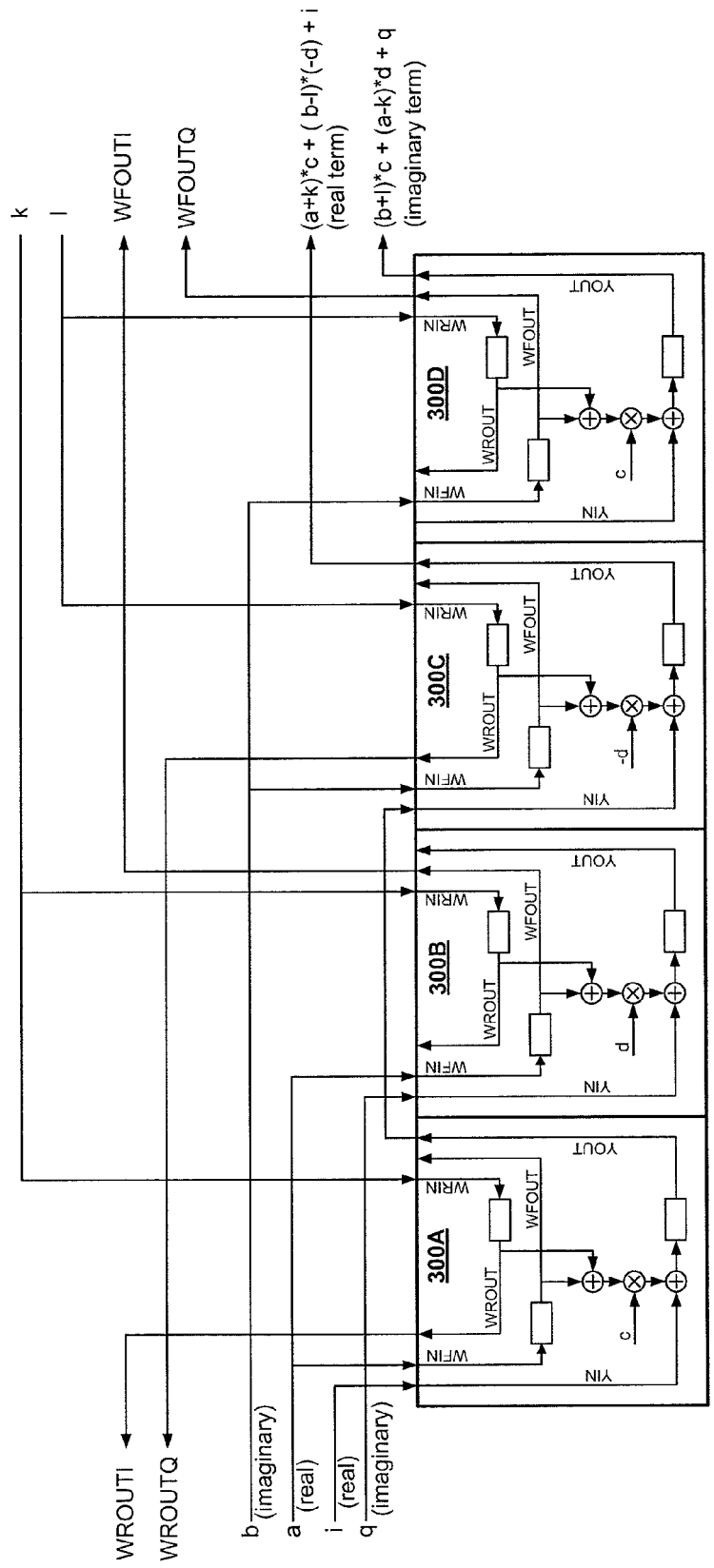
FIG. 20 is a simplified block diagram of SPEs cascaded together to implement an FIR using complex data according to an embodiment of the invention.

FIG. 20 is a simplified block diagram of SPEs (300A, 300B, 300C, and 300D) cascaded together to implement one tap of an FIR using complex data comprising real and imaginary terms. In FIG. 20, four instances of the SPE 300 are combined with predetermined routing amongst them to create a circuit that can act as a tap for a complex filter, equivalent in functionality to the SPE as a tap for a real filter. As a tap for a complex filter, the Complex SPE is able to delay the inputs (using the WF_DELAY, WR_DELAY blocks in the SPEs), add/subtract the forward and reverse complex data samples (using the ADDSUB block in the SPEs), implement multiply-add on the input data (using the MADD/MACC block in the SPEs) and delay the adder-chain samples (using the Y_DELAY block in the SPEs).

Thus, as configured with the inter-block routing shown in FIG. 20, the complex SPE=(a+jb)*(c+jd)+k+jl)*(c−jd)+(i+jq)=[(a+k)*c+(b−l)*(−d)+i]+j[(b+l)*c+(a−k)*d+q].

The required routing includes use of propagate chains and broadcast chains that are discussed below in FIGS. 26 and 27. The terms (c+jd) and (c−jd) are complex conjugate coefficients stored in H_RAM or fed through the HFIN inputs. The term (a+jb) is the forward data chain and the term (k+jl) is the reverse data chain. Both use the broadcast routing scheme discussed below in FIG. 27. The term (i+jq) is the output of the previous complex SPE and uses the propagate routing scheme discussed below in FIG. 26.

Figure 21:
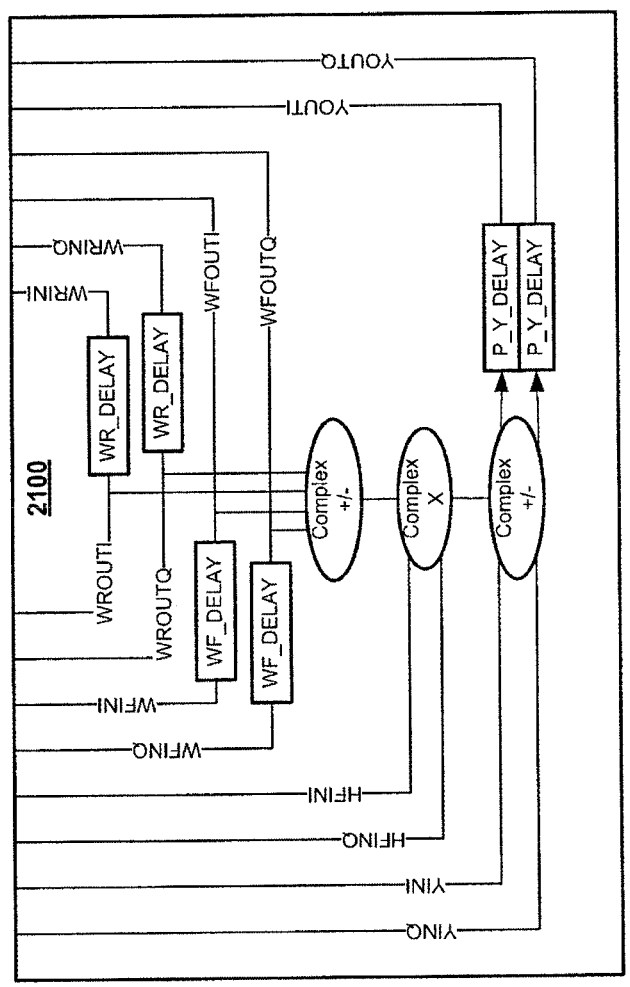
FIG. 21 is a simplified block diagram of an exemplary SPE configured for complex numbers in signal processing calculations.

FIG. 21 is a simplified block diagram of an SPE 2100 configured for complex numbers in signal processing calculations in a similar manner to the SPE 300 except data paths and computation resources are provided for both a real part (Q) and an imaginary part (I). FIG. 21 shows a high-level view of a complex SPE 2100 constructed out of 4 SPEs 300. The complex SPE 2100 can implement a MADD/MACC for complex numbers with programmable delays on the data forward and reverse chains as well as the adder chain. Therefore, complex filter circuits can be implemented using the complex SPE 300CP as a building block in much the same way as discussed above with respect to the basic SPE 300.

Figure 22:
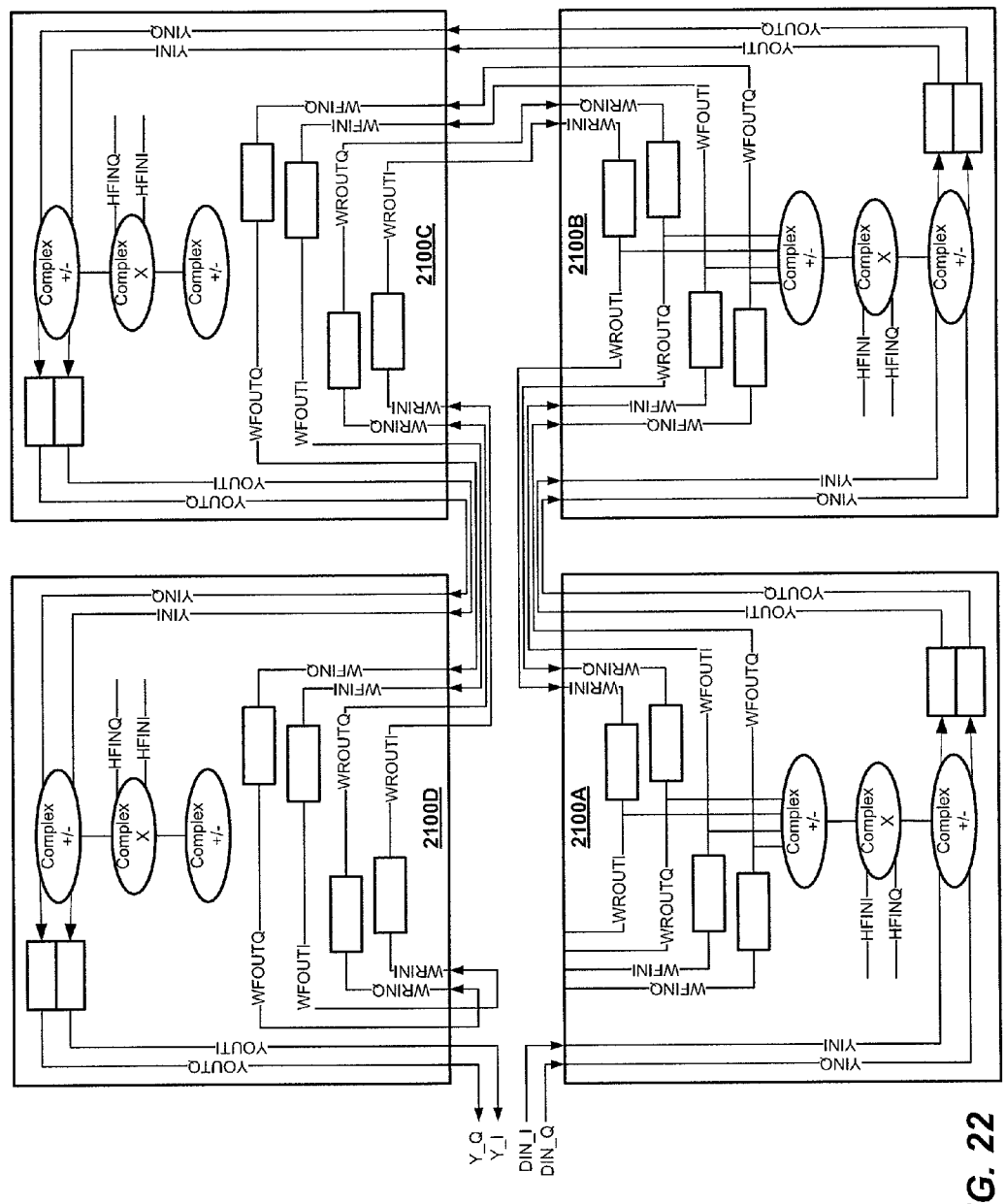
FIG. 22 is a simplified block diagram of complex number SPEs cascaded together to perform an FIR with eight conjugate symmetric coefficients according to a particular embodiment of the invention.

FIG. 22 is a simplified block diagram of complex number SPEs (2100A, 2100B, 2100C, and 2100D) cascaded together to perform an FIR with eight conjugate symmetric coefficients. For presentation reasons only, FIG. 22 illustrates the SPEs 2100 folded back to fit on the page rather than in a straight line. Thus, SPE 2100A feeds SPE 2100B, which feeds SPE 2100C, which feeds SPE 2100D. The data input stream is fed into SPE 2100A as DIN_I and DIN_Q and the data output stream emerges from SPE 2100D as Y_I and Y_Q.

In FIG. 22, a complex FIR is implemented with 8 conjugate symmetric coefficients stored in coefficient RAM. In general, the construction of complex FIRs is similar to the construction of the real FIRs with the SPE 300 replaced by the Complex SPE 2100. Optimizations such as resource sharing (such as in FIGS. 14, 17 and 18) or multi-channel data handling (such as in FIGS. 17 and 18) can be implemented in a manner similar to the real FIR case.

By including the reverse data chain fed from the forward data chain, the 8 coefficient complex FIR is implemented using 4 Complex SPEs 2100 (i.e., total of 16 SPEs 300) with cascaded connections across them. In other words, use of the reverse data chain halves the number of Complex SPEs 2100 required from 8 to 4. Note that the FIR construction is identical to the real FIR examples shown previously except that SPE 300 is replaced by Complex SPE 2100 and data paths for both I and Q are provided.

Figure 23:
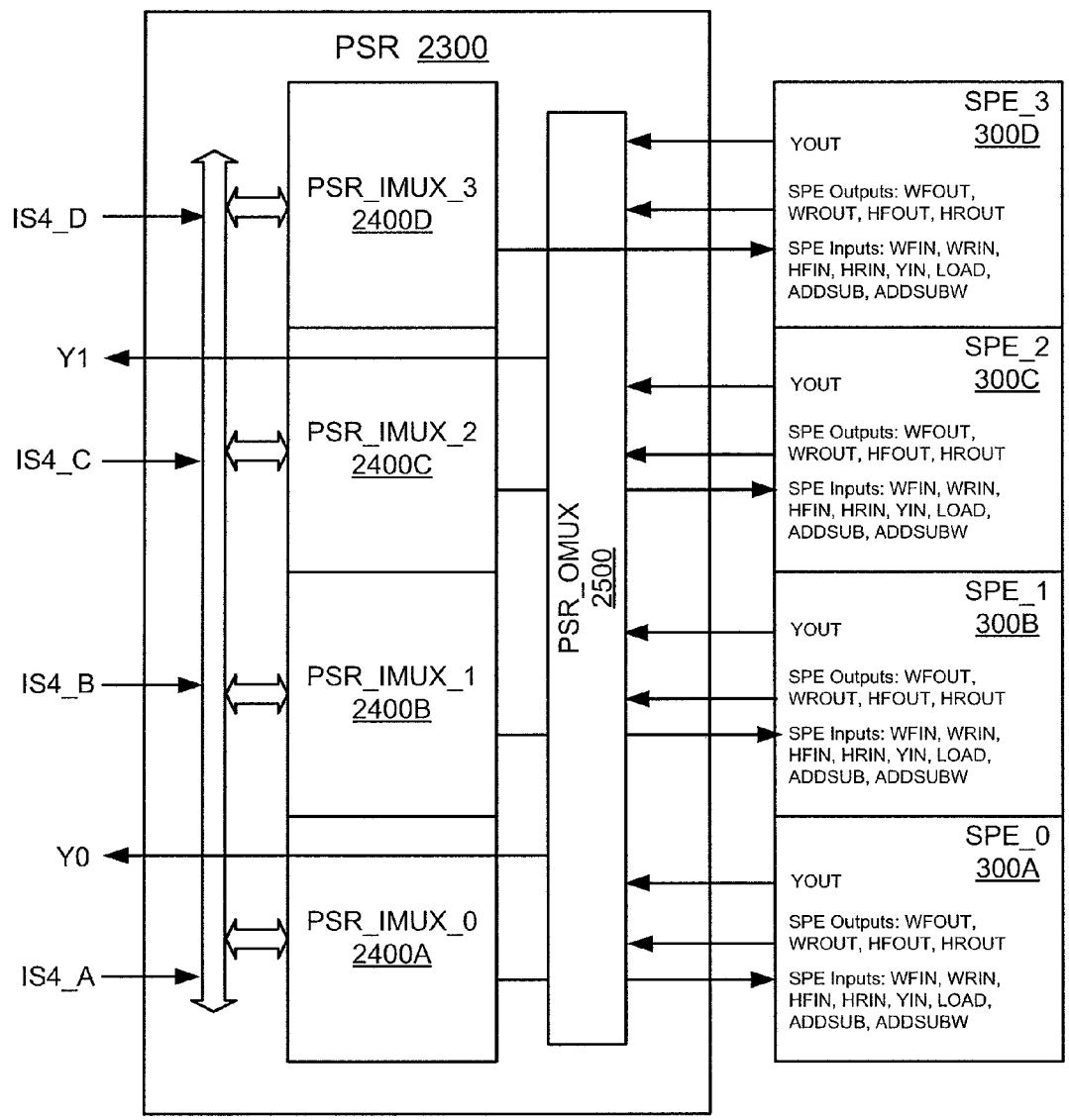
FIG. 23 is a simplified block diagram of one possible programmable SPE routing block for interfacing between SPEs and the programmable logic array.

FIG. 23 is a simplified block diagram of one possible programmable SPE routing block (PSR) 2300 for interfacing between SPEs and the programmable logic array. One purpose of the PSR 2300 is to provide fast routing (without using programmable logic fabric) between SPEs (300A, 300B, 300C, and 300D) to support most signal processing algorithms while using minimal resources. The PSR 2300 includes four instances of PSR_IMUX (2400A, 2400B, 2400C, and 2400D). Thus, for this embodiment, there is a PSR_IMUX 2400 from each SPE 300 to provide flexible routing of inputs to the PSR 2300 to inputs of the SPEs 300. In this embodiment, one instance of PSR_OMUX 2500 is configured as a block that routes outputs form the SPEs 300 to outputs from the PSR 2300.

Figure 24:
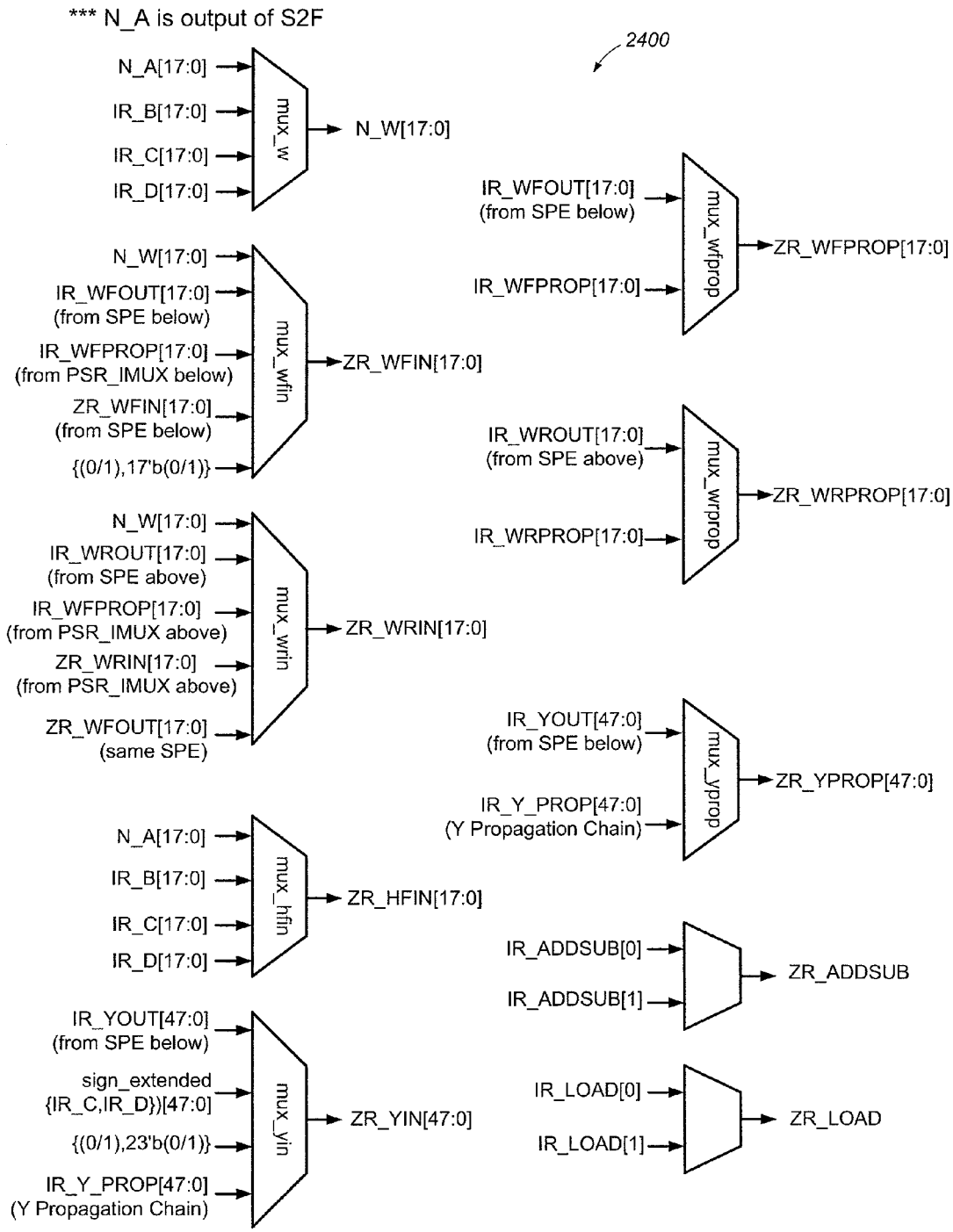
FIG. 24 is a simplified block diagram of programmable routing multiplexers for inputs to the SPEs according to an embodiment of the invention.

FIG. 24 is a simplified block diagram of programmable routing multiplexers for inputs to the SPEs. FIG. 24 shows examples of possible routing multiplexers within a PSR_IMUX 2400.

The input N_A is the output of the S2F block whereas IR_B, IR_C, and IR_D are direct inputs from the programmable logic fabric. A single output N_W can be selected using the multiplexer (mux_w). For each of the data busses (e.g., WFOUT, WROUT, YOUT), there is a propagate multiplexer and a selection multiplexer.

The selection multiplexers (i.e., mux_wfin, mux_wrin, mux_hfin, and mux_yin) pick an input for the current SPE 300. Possible inputs for the selection multiplexer (mux_wfin) may include fabric inputs (N_W), the WFOUT of SPE below for cascaded connection (IR_WFOUT), the output of the corresponding multiplexer in the PSR_IMUX below, or a constant value. Similar selection inputs are available multiplexer (mux_wrin), but for propagating the reverse data chain the opposite direction. Possible selectable inputs for multiplexers (mux_hfin and mux_yin) are as shown in FIG. 24.

The propagate multiplexers (mux_wfprop, mux_wrprop, and mux_wyprop) are used for building a propagate chain for the forward data chain, reverse data chain, and output data chain, respectively, as illustrated in previous figures. Possible selectable inputs for the propagate multiplexers (mux_wfprop, mux_wrprop, and mux_wyprop) are as shown in FIG. 24.

The control inputs from the programmable logic fabric (e.g., LOAD, ADDSUBW, etc.) may have multiplexers (shown in the lower right corner of FIG. 24) to provide flexibility in their use.

Figure 25:
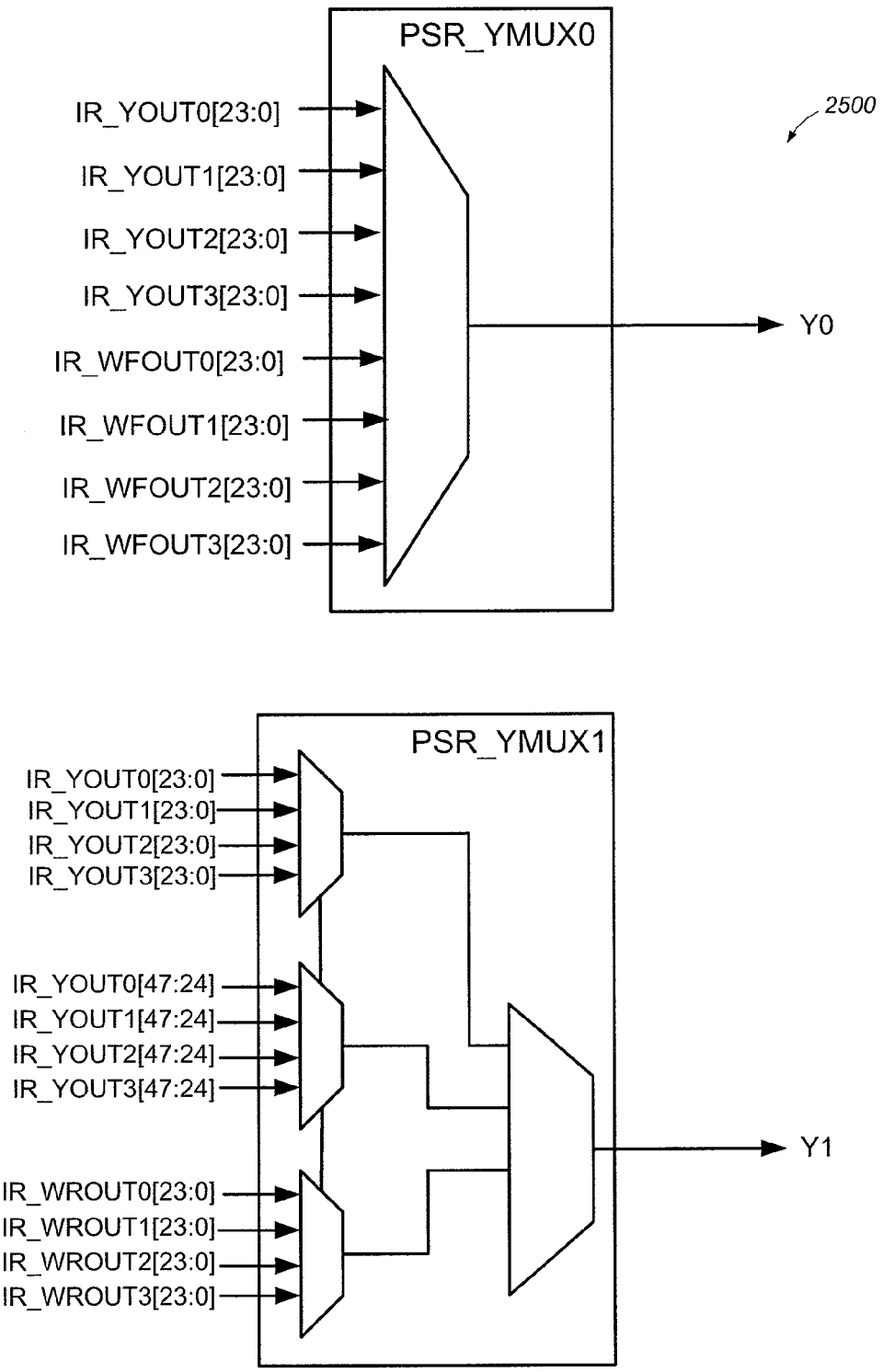
FIG. 25 is a simplified block diagram of programmable routing multiplexers for outputs from the SPEs.

FIG. 25 is a simplified block diagram of a programmable routing multiplexer 2500 for outputs from the SPEs 300.

The PSR 2300 generally includes has two primary outputs, Y0 and Y1. Multiplexer PSR_YMUX0 provides selection of various outputs related to Y0 from the SPEs 300 to be output to the programmable logic fabric. Similarly, multiplexer PSR_YMUX1 provides selection of various outputs related to Y1 from the SPEs 300 to be output to the programmable logic fabric.

Figure 26:
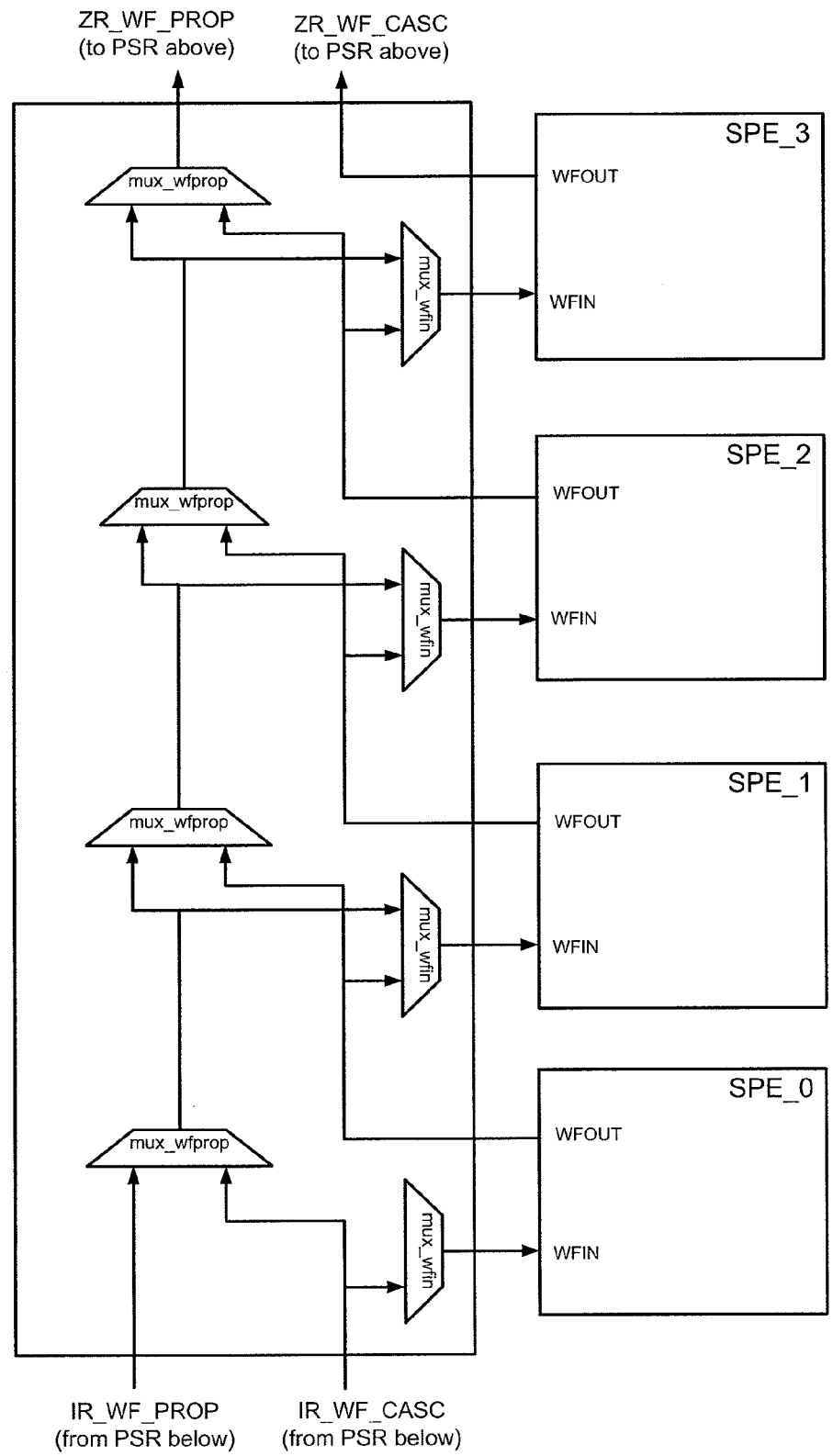
FIG. 26 is a simplified block diagram of programmable routing multiplexers showing some possible interfaces between SPEs.

FIG. 26 is a simplified block diagram of programmable routing multiplexers showing some possible interfaces between SPEs 300. FIG. 26 shows an example of propagation structure using the propagation multiplexers and selection multiplexers that enables a WFOUT output to propagate to a non-neighboring SPE 300 as long as the intermediate SPEs 300 have their WFOUT connected to the WFIN of the next SPE 300. While not show, a similar routing scheme may be supported for the WROUT and YOUT busses.

The WFOUT output of an SPE 300 can be routed to the WFIN of the SPE 300 immediately above it using the multiplexers (mux_wfin). In addition, it is possible to route the WFOUT output to the WFIN of any SPE 300 above it using the chain of propagate multiplexers (mux_wfprop). The routing resources shown enable only one WFOUT signal to "hop" (i.e., jump over another SPE 300) at a time. However, this capability is sufficient to support most signal processing algorithms with the use of minimum resources.

Figure 27:
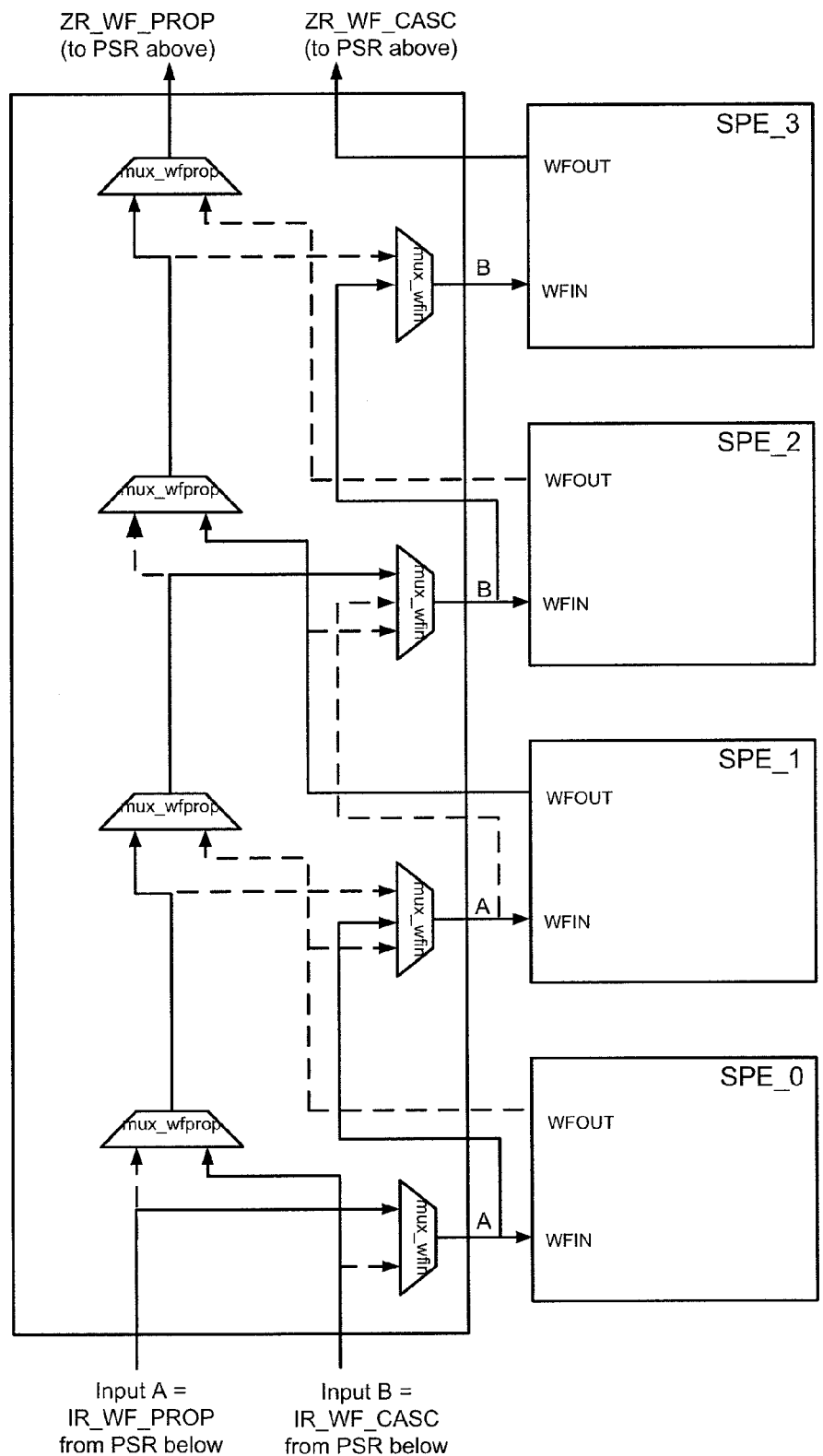
FIG. 27 is a simplified block diagram of programmable routing multiplexers showing other possible interfaces between SPEs.

FIG. 27 is a simplified block diagram of programmable routing multiplexers showing more possible interfaces between SPEs 300. FIG. 26 shows an example of broadcast structure using the propagation multiplexers and selection multiplexers. Solid lines show routing connections, while dashed lines show possible routing connections that may not be used in the broadcast structure. This broadcast routing scheme enables a signal to be routed to adjacent SPEs 300 without consuming the propagation multiplexers. In the example shown, the input signals A and B coming into the PSR are broadcast to two SPEs each using the connection between adjacent multiplexers (mux_wfin). This keeps the propagate chain free to route the WFOUT of SPE_1 to the PSR output where it connects to the PSR above it.

As a non-limiting example, this broadcast scheme may be used in implementation of complex FIRs discussed above. The WFOUT chain (forward data chain) is used as an example but the WROUT chain (reverse data chain) also supports similar routing.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A Signal Processing Engine (SPE), comprising:
a process input;
a forward delay chain operably coupled between a forward data input and a forward data output and configured for generating a selectable forward tap;
a reverse delay chain operably coupled between a reverse data input and a reverse data output and configured for generating a selectable reverse tap;
a coefficient buffer configured for circulating coefficients within the coefficient buffer and generating a coefficient output;
an add/subtract unit configured for adding or subtracting the selectable forward tap and the selectable reverse tap to generate an intermediate output;
a multiply unit configured to multiply the intermediate output and the coefficient output to generate a multiply result and further configured to bypass, add, or subtract the multiply result with the process input to generate a process output; and
an output delay chain comprising a plurality of serially connected shift registers operably coupled between the process output and a clock delayed process output, the output delay chain including a programmable length.

2. The SPE of claim 1, wherein the SPE is configured for operable coupling with a plurality of other SPEs by operably coupling at least one of:
the forward delay chain of the SPE to a forward delay chain of at least one of the plurality of other SPEs;
the reverse delay chain of the SPE to a reverse delay chain of at least one of the plurality of other SPEs; and
the process input of the SPE to a process output of at least one of the plurality of other SPEs.

3. The SPE of claim 1, further comprising an additional forward delay chain, an additional reverse delay chain, an additional add/subtract unit, an additional multiply unit, and an additional output delay chain to form a complex SPE configured for supporting a real data path and an imaginary data path.

4. The SPE of claim 1, wherein the forward delay chain further comprises:
- a plurality of serially connected shift registers with the forward data input operably coupled to a first shift register in the forward delay chain and the forward data output operably coupled to a last shift register in the forward delay chain;
- a multiplexer with inputs operably coupled to outputs of the plurality of serially connected shift registers and an output operably coupled to the selectable forward tap; and
- a counter operably coupled to the multiplexer and configured for selecting an input of the multiplexer responsive to a desired count value of the counter.

5. The SPE of claim 1, wherein the reverse delay chain further comprises:
- a plurality of serially connected shift registers with the reverse data input operably coupled to a first shift register in the reverse delay chain and the reverse data output operably coupled to a last shift register in the reverse delay chain;
- a multiplexer with inputs operably coupled to outputs of the plurality of serially connected shift registers and an output operably coupled to the selectable reverse tap; and
- a counter operably coupled to the multiplexer and configured for selecting an input of the multiplexer responsive to a desired count value of the counter.

6. The SPE of claim 1, wherein the coefficient buffer further comprises a plurality of serially connected shift registers operably coupled as a circular buffer and the coefficient output is operably coupled to an output of one of the plurality of serially connected shift registers.

7. A Signal Processing Engine (SPE), comprising:
- a process input;
- a forward delay chain operably coupled between a forward data input and a forward data output and configured for generating a selectable forward tap;
- a reverse delay chain operably coupled between a reverse data input and a reverse data output and configured for generating a selectable reverse tap;
- a coefficient buffer configured for circulating coefficients within the coefficient buffer and generating a coefficient output;
- a first bypassable pipeline register for selectively adding a pipeline delay to the selectable forward tap to generate a first addend;
- a second bypassable pipeline register for selectively adding a pipeline delay to the selectable reverse tap to generate a second addend;
- an adder/subtractor for adding or subtracting the first addend and the second addend to generate a result;
- a third bypassable pipeline register for selectively adding a pipeline delay to the result to generate an intermediate output;
- a multiply unit configured to multiply the intermediate output and the coefficient output to generate a multiply result and further configured to bypass, add, or subtract the multiply result with the process input to generate a process output; and
- an output delay chain configured for generating a delayed process output as a clock delayed version of the process output.

8. The SPE of claim 7, wherein the add/subtract unit further comprises a multiplexer operably coupled between the adder/subtractor and the third bypassable pipeline register for selecting the first addend, the second addend, the result, or a zero value for an input to the third bypassable pipeline register.

9. A Signal Processing Engine (SPE), comprising:
- a process input;
- a forward delay chain operably coupled between a forward data input and a forward data output and configured for generating a selectable forward tap;
- a reverse delay chain operably coupled between a reverse data input and a reverse data output and configured for generating a selectable reverse tap;
- a coefficient buffer configured for circulating coefficients within the coefficient buffer and generating a coefficient output;
- an add/subtract unit configured for adding or subtracting the selectable forward tap and the selectable reverse tap to generate an intermediate output;
- a multiplier for multiplying the intermediate output and the coefficient output to generate a multiply result;
- one or more bypassable pipeline registers for selectively adding pipeline delays to the multiply result;
- an adder/subtractor for adding or subtracting the multiply result and the process input to generate an accumulator result;
- an output bypassable pipeline register for selectively adding a pipeline delay to the accumulator result to generate a process output; and
- an output delay chain configured for generating a delayed process output as a clock delayed version of the process output.

10. The SPE of claim 9, wherein the multiply unit further comprises a multiplexer operably coupled between the accumulator result and the adder/subtractor for selectively presenting the accumulator result, the process input, or a zero value to the adder/subtractor for arithmetic combination with the multiply result.

11. The SPE of claim 9, wherein the output delay chain further comprises a plurality of serially connected shift registers with a programmable length wherein the process output is operably coupled to an input of a first shift register in the output delay chain and the clock delayed version of the process output is operably coupled to an output of a last shift register in the output delay chain.

12. A programmable logic array, comprising:
- a plurality of programmable logic blocks configured to be programmable for a variety of interconnections and a variety of functions; and
- a Signal Processing Engine (SPE), operably coupled to at least some of the plurality of programmable logic blocks, the SPE comprising:
  - a clock divider configured for dividing down a clock input to supply selectable independent divisor values for a delay chain clock, a coefficient clock, and a multiply clock;
  - a forward delay chain operably coupled to the delay chain clock and between a forward data input and a forward data output and configured for generating a selectable forward tap at a rate of the coefficient clock;
  - a reverse delay chain operably coupled to the delay chain clock and between a reverse data input and a reverse data output and configured for generating a selectable reverse tap at a rate of the coefficient clock;

a coefficient buffer operably coupled to the coefficient clock and configured for circulating coefficients within the coefficient buffer and generating a coefficient output;

an add/subtract unit operably coupled to the coefficient clock and configured for adding or subtracting the selectable forward tap and the selectable reverse tap to generate an intermediate output;

a multiply unit operably coupled to the multiply clock and configured to multiply the intermediate output and the coefficient output to generate a process output; and an output delay chain operably coupled to the multiply clock and the process output and configured for generating a delayed process output.

13. The programmable logic array of claim 12, wherein the clock divider further comprises:
    a clock divider chain for generating a plurality of clocks at a plurality of frequencies;
    a first multiplexer for selecting one of the plurality of clocks as the delay chain clock;
    a second multiplexer for selecting one of the plurality of clocks as the coefficient clock; and
    a third multiplexer for selecting one of the plurality of clocks as the multiply clock.

14. The programmable logic array of claim 12, further comprising a programmable routing block operably coupled between the SPE and the plurality of programmable logic blocks, the programmable routing block configured to:
    correlate data input rates between the plurality of programmable logic blocks and the SPE;
    correlate data output rates between the plurality of programmable logic blocks and the SPE; and
    provide enhanced routing between the SPE and one or more additional SPEs.

15. The programmable logic array of claim 12, wherein the add/subtract unit further comprises:
    a first bypassable pipeline register for selectively adding a pipeline delay to the selectable forward tap to generate a first addend;
    a second bypassable pipeline register for selectively adding a pipeline delay to the selectable reverse tap to generate a second addend;
    an adder/subtractor for adding or subtracting the first addend and the second addend to generate a result; and
    a third bypassable pipeline register for selectively adding a pipeline delay to the reslt to generate the intermediate output.

16. The programmable logic array of claim 15, wherein the add/subtract unit further comprises a multiplexer operably coupled between the adder/subtractor and the third bypassable pipeline register for selecting the first addend, the second addend, the result, or a zero value for an input to the third bypassable pipeline register.

17. The programmable logic array of claim 12, wherein the multiply unit further comprises:
    a multiplier for multiplying the intermediate output and the coefficient output to generate a multiply result;
    one or more bypassable pipeline registers for selectively adding pipeline delays to the multiply result;
    a multiplexer for selectively presenting an accumulator result, a process input, or a zero value on a multiplexer output;
    an adder/subtractor for adding or subtracting the multiply result and the multiplexer output to generate the accumulator result; and an output bypassable pipeline register for selectively adding a pipeline delay to the accumulator result to generate the process output.

18. The programmable logic array of claim 12, wherein the forward delay chain further comprises:
    a plurality of serially connected shift registers with the forward data input operably coupled to a first shift register in the forward delay chain and the forward data output operably coupled to a last shift register in the forward delay chain;
    a multiplexer with inputs operably coupled to outputs of the plurality of serially connected shift registers and an output operably coupled to the selectable forward tap; and
    a counter operably coupled to the multiplexer and configured for selecting an input of the multiplexer responsive to a desired count value of the counter.

19. The programmable logic array of claim 12, wherein the reverse delay chain further comprises:
    a plurality of serially connected shift registers with the reverse data input operably coupled to a first shift register in the reverse delay chain and the reverse data output operably coupled to a last shift register in the reverse delay chain;
    a multiplexer with inputs operably coupled to outputs of the plurality of serially connected shift registers and an output operably coupled to the selectable reverse tap; and
    a counter operably coupled to the multiplexer and configured for selecting an input of the multiplexer responsive to a desired count value of the counter.

20. The programmable logic array of claim 12, wherein the coefficient buffer further comprises a plurality of serially connected shift registers operably coupled as a circular buffer and the coefficient output is operably coupled to an output of one of the plurality of serially connected shift registers.

21. The programmable logic array of claim 12, wherein the output delay chain further comprises a plurality of serially connected shift registers with a programmable length wherein the process output is operably coupled to an input of a first shift register in the output delay chain and the delayed process output is operably coupled to an output of a last shift register in the output delay chain.

22. A method, comprising:
    generating a selectable forward tap with a forward delay amount between a forward data input and a forward data output of a forward delay chain;
    generating a selectable reverse tap with a reverse delay amount between a reverse data input and a reverse data output of a reverse delay chain;
    generating a coefficient output from a coefficient buffer configured for circulating coefficients;
    adding or subtracting the selectable forward tap and the selectable reverse tap to generate an intermediate output;
    multiplying the intermediate output and the coefficient output to generate a multiply result;
    combining the multiply result and a process input by bypassing, adding, or subtracting the process input with the multiply result to generate an accumulator result; and
    delaying the accumulator result by a programmable number of clock cycles to generate a process output by shifting the accumulator result through a plurality of serially connected shift registers with the process output operably coupled to one shift register of the plurality.

23. The method of claim 22, further comprising operably coupling:
  the forward delay chain to a forward delay chain of at least one of a plurality of Signal Processing Engines (SPEs);
  the reverse delay chain to a reverse delay chain of at least one of the plurality of SPEs; and
  the process input to at least one process output of the plurality of SPEs.

24. The method of claim 22, further comprising:
  correlating data input rates between a plurality of programmable logic blocks and a Signal Processing Engine (SPE);
  correlating data output rates between the plurality of programmable logic blocks and the SPE; and
  providing enhanced routing between the SPE and one or more additional SPEs.

25. The method of claim 22, further comprising:
  forming an additional data path for performing complex arithmetic using a real data path and an imaginary data path by:
    generating an additional selectable forward tap with an additional forward delay amount between an additional forward data input and an additional forward data output of an additional forward delay chain;
    generating an additional selectable reverse tap with an additional reverse delay amount between an additional reverse data input and an additional reverse data output of an additional reverse delay chain;
    generating an additional coefficient output from an additional coefficient buffer configured for circulating coefficients;
    adding or subtracting the additional selectable forward tap and the additional selectable reverse tap to generate an additional intermediate output;
    multiplying the additional intermediate output and the additional coefficient output to generate an additional multiply result;
    combining the additional multiply result and an additional process input by bypassing, adding, or subtracting the additional process input with the additional multiply result to generate an additional accumulator result; and
    delaying the additional accumulator result by the programmable number of clock cycles to generate an additional process output.

26. The method of claim 22, wherein generating the selectable forward tap further comprises:
  shifting the forward data input through a plurality of serially connected shift registers with the forward data output operably coupled to a last shift register of the plurality;
  counting to a desired count value; and
  selecting an output of one shift register of the plurality as the selectable forward tap responsive to the desired count value.

27. The method of claim 22, wherein generating the selectable reverse tap further comprises:
  shifting the reverse data input through a plurality of serially connected shift registers with the reverse data output operably coupled to a last shift register of the plurality;
  counting to a desired count value; and
  selecting an output of one shift register of the plurality as the selectable reverse tap responsive to the desired count value.

28. The method of claim 22, wherein generating the coefficient output further comprises:
  re-circulating a plurality of coefficients in the coefficient buffer; and
  operably coupling one coefficient of the plurality to the coefficient output.

29. A method, comprising:
  generating a selectable forward tap with a forward delay amount between a forward data input and a forward data output of a forward delay chain;
  generating a selectable reverse tap with a reverse delay amount between a reverse data input and a reverse data output of a reverse delay chain;
  generating a coefficient output from a coefficient buffer configured for circulating coefficients;
  selectively adding a pipeline delay to the selectable forward tap to generate a first addend;
  selectively adding a pipeline delay to the selectable reverse tap to generate a second addend;
  adding or subtracting the first addend and the second addend to generate a result;
  selectively adding a pipeline delay to the result to generate an intermediate output;
  multiplying the intermediate output and the coefficient output to generate a multiply result;
  combining the multiply result and a process input by bypassing, adding, or subtracting the process input with the multiply result to generate an accumulator result; and
  delaying the accumulator result by a programmable number of clock cycles to generate a process output.

30. The method of claim 29, wherein the adding or subtracting the selectable forward tap and the selectable reverse tap further comprises selecting the first addend, the second addend, the result, or a zero value as an input to the act of selectively adding a pipeline delay to the result to generate the intermediate output.

31. The method of claim 29, wherein delaying the accumulator result further comprises shifting the accumulator result through a plurality of serially connected shift registers with the process output operably coupled to one shift register of the plurality.

32. A method, comprising:
  generating a selectable forward tap with a forward delay amount between a forward data input and a forward data output of a forward delay chain;
  generating a selectable reverse tap with a reverse delay amount between a reverse data input and a reverse data output of a reverse delay chain;
  generating a coefficient output from a coefficient buffer configured for circulating coefficients;
  adding or subtracting the selectable forward tap and the selectable reverse tap to generate an intermediate output;
  selectively adding pipeline delays to the multiply result;
  selectively adding a pipeline delay to the accumulator result to generate the process output;
  combining the multiply result and a process input by bypassing, adding, or subtracting the process input with the multiply result to generate an accumulator result; and
  delaying the accumulator result by a programmable number of clock cycles to generate a process output.

33. The method of claim 32, wherein the multiplying further comprises selectively presenting the accumulator result, the process input, or a zero value as another addend to the multiply result in the act of combining.

* * * * *